United States Patent [19]
Kodaira

[11] Patent Number: 5,805,867
[45] Date of Patent: Sep. 8, 1998

[54] MULTI-PROCESSOR SIMULATION APPARATUS AND METHOD

[75] Inventor: Masako Kodaira, Kawasaki, Japan

[73] Assignee: Fujitsu Limited, Kawasaki, Japan

[21] Appl. No.: 863,557

[22] Filed: May 27, 1997

Related U.S. Application Data

[63] Continuation of Ser. No. 418,582, Apr. 6, 1995, abandoned.

[30] Foreign Application Priority Data

Apr. 6, 1994 [JP] Japan .................... 6-068648

[51] Int. Cl.$^6$ .................................... G06F 9/00
[52] U.S. Cl. ........................... 395/500; 364/578
[58] Field of Search .................. 395/500, 680, 395/474; 364/578

[56] References Cited

U.S. PATENT DOCUMENTS

| | | | |
|---|---|---|---|
| 5,361,375 | 11/1994 | Ogi | 395/800 |
| 5,446,841 | 8/1995 | Kitano et al. | 395/200 |
| 5,446,915 | 8/1995 | Pierce | 395/800 |

OTHER PUBLICATIONS

Reiher, Simulating Networks of Superscalar Processors, IEEE, pp. 125–133, 1994.

Davis, Tango: A Multiprocessor Simulation and Tracing System, Tech. Rpt CSL–TR–90–239, Jul. 1, 1990.

Goldschmidt, Tango Introduction and Tutorial, Computer Systems Lab., Stanford University, Feb. 22, 1991.

Eddy Olk, "PARSE: Simulation of Message Passing Communication Networks", 1994 Simulation Symposium, pp. 115–124 (1994).

Bernady O. Apduhan, "Experiments of a Reconfigurable Multiprocessor Simulation on a Distributed Environment", IPCCC 1992, pp. 539–546 (1992).

*Primary Examiner*—Kevin J. Teska
*Assistant Examiner*—A. S. Roberts
*Attorney, Agent, or Firm*—Staas & Halsey

[57] ABSTRACT

A multi-processor simulation apparatus according to the present invention simulates the process of a single processor and communication process between processors by preparing a plurality of simulators, each of which operates independently of the others, on a single information process apparatus. The simulation of the communication process is carried out by the transmission of information through synchronous communication and by the request of communication start through asynchronous communication. It is also carried out directly between simulators or through a process which is operated independently of the simulators.

23 Claims, 21 Drawing Sheets

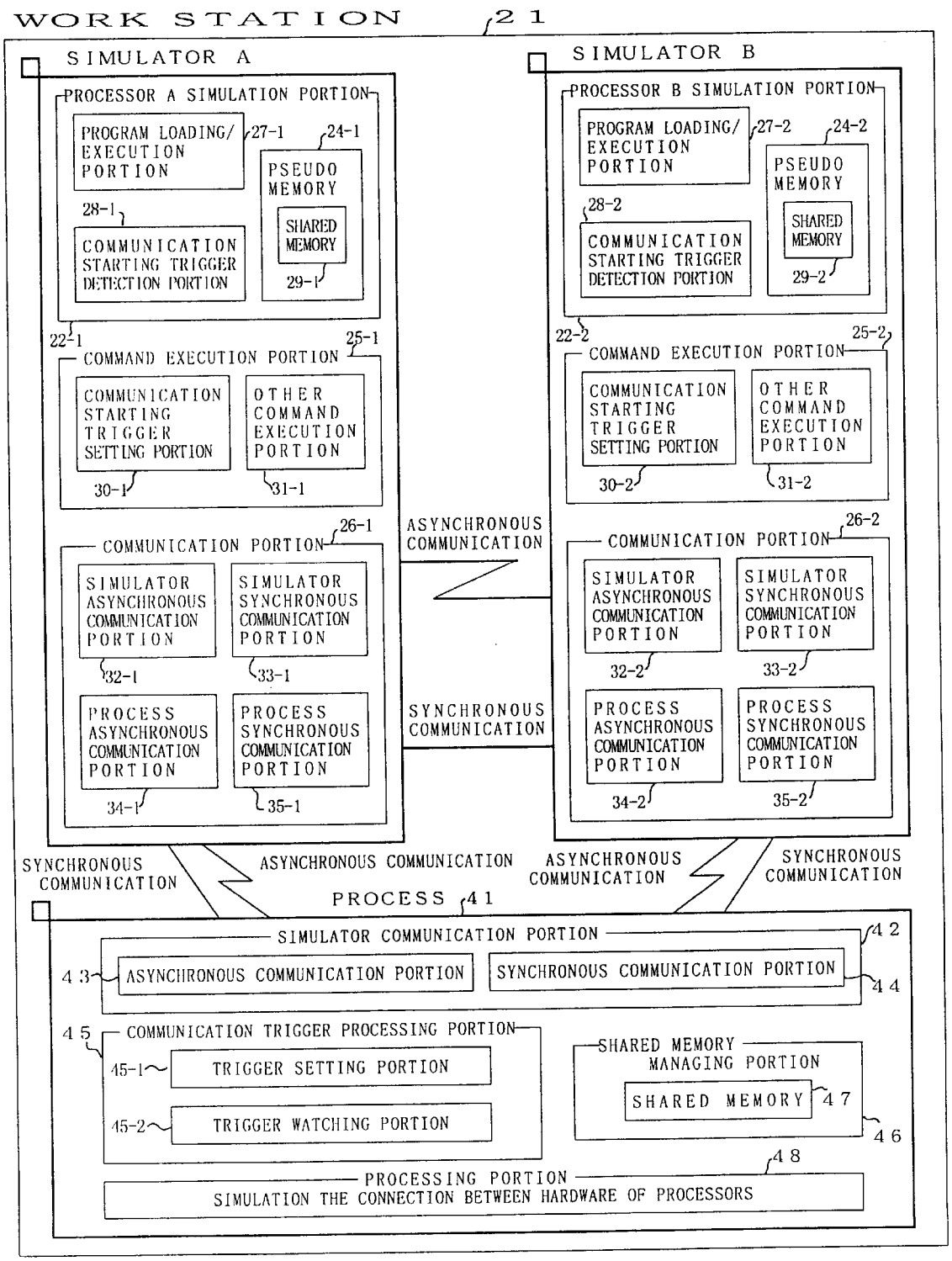
F I G. 8

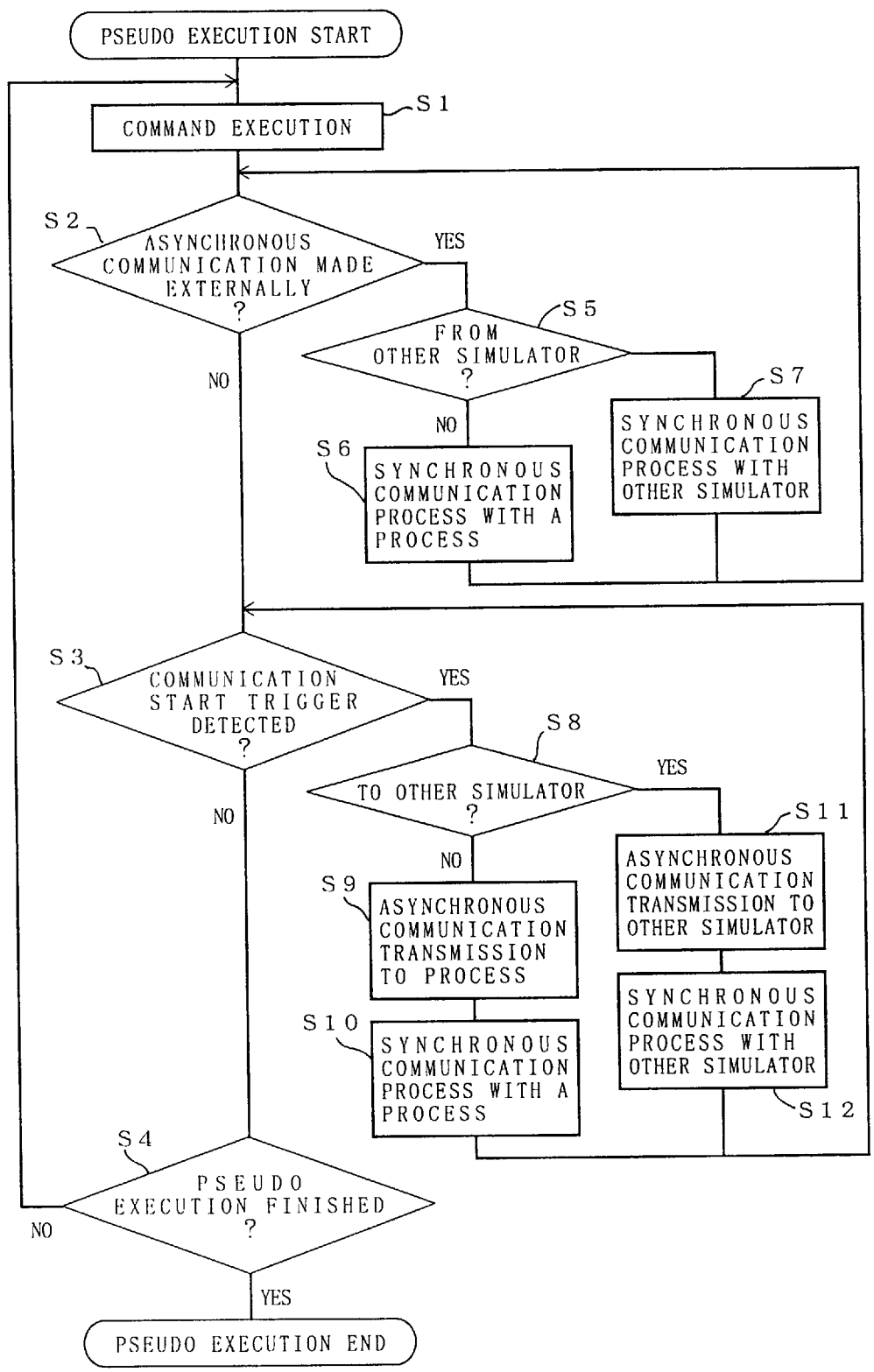
F I G. 9

MULTI-PROCESSOR SIMULATION APPARATUS AND METHOD

This application is a continuation of application Ser. No. 08/418,582, filed Apr. 6, 1995, now abandoned.

BACKGROUND OF THE INVENTION

1. Field of the Invention

The present invention relates to a computer system having a multi-process function and, more particularly, an apparatus and a method for simulating communication functions between processors in the multi-processor system.

2. Description of the Related Art

More and more information processing apparatuses using multi-processor arrangements are being used these days as the amount of information to be processed by computers becomes larger and the information processing becomes more complicated. The processing speed of the entire multi-processor system can be increased when parallel processing is conducted at the same time by a plurality of processors. It is quite important in this type of system that the reliability of the communication functions between processors is enhanced. Particularly for making correct communication between different kinds of processors, testing and debugging of the program for each processor are need to be repeated to make as few as possible communication errors between processors.

FIG. 1 shows a method of testing and debugging the program for the multi-processor system and this method is conducted using actual devices. In FIG. 1, programs 2-1 and 2-2 are loaded in processors X and Y, respectively, which are connected to each other by communications hardware 3-1 and 3-2, respectively. The testing and debugging of the program 2-1 for the processor X are carried out through a terminal 1-1, while those of the program 2-2 for the processor Y through a terminal 1-2. The testing and debugging of programs for both processors are conducted in this manner, including a communication process and the connecting operation of the hardware 3-1 and 3-2.

When the testing and debugging of programs for the multi-processor system are carried out using actual devices, however, there can become a shortage of available processors on site, with the disadvantage of causing delays in the processing function of that site. In addition, this actual device test takes a great deal of time for checking whether hardware or software has the caused an error.

To solve this problem, therefore, testing and debugging methods of various kinds are carried out not by using actual devices but by using simulators.

FIG. 2 shows the simulation method by which a substitutive program is used for each processor. A simulator X which is realized on a work station 4-1 serves to simulate the operation of the single processor X. A substitute 5-1 for the processor Y is installed in the work station 4-1 to serve as a program for testing the connection portion of processors X and Y. It has a simple function of returning predetermined data when it receives test data from the simulator X. The same process applies to a simulator Y and a substitute 5-2 of the processor X in a work station 4-2.

FIG. 3 shows the other simulation method by which a pseudo IO (input and output) program is used for each processor. The simulator X which is realized on a work station 6-1 serves to simulate the operation of the processor X. A pseudo IO 7-1 which is installed in the work station 6-1 serves as a program to simulate input/output devices in the system. The same process applies to a simulator Y and a pseudo IO 7-2 in a work station 6-2.

In the case of the simulation methods shown in FIGS. 2 and 3, program testing is carried out on each processor which forms the multi-processor system, respectively, as described above. In these methods, however, the communication process actually conducted between processors is not simulated. This causes the debugging of the communication process to depend upon those tests which are carried out using actual devices.

To the contrary, the method shown in FIG. 4 by which a plurality of simulators are realized on a work station has been proposed. First, second and third simulators 10-1, 10-2 and 10-3 respectively, shown in FIG. 4 simulate a processor, and a bus simulator 9 simulates communication paths. A simulator manager 8 simulates the communication paths while controlling the simulator for each processor. According to this method, operation between processors can be simulated without using any actual device.

The above-described conventional simulation methods, however, have the following problems.

In the method shown in FIG. 2 by which a substitute for each processor is used, test data is only exchanged between the simulator and the substitute for the processor, but no communication is made relative to other processors which are actually operating. Accordingly the testing and debugging of a more detailed communication process cannot be achieved.

In the method shown in FIG. 3 in which a pseudo IO is used, simulation is limited to the input and output of data between the simulator and its peripheral equipment, and the communication process between processors is not tested. The response timing by the pseudo IO is different from that in the actual system operation.

In the methods shown in FIGS. 2 and 3, therefore, simulation is limited to the operation of a single processor and the testing and debugging of communication processes between processors must be carried out using actual devices. In this cause, actual devices are occupied by the testing and debugging, thereby for instance delay of the manufacturing process. Further, it is difficult in the testing by actual devices that the subtle timing of connections between processors and the competition resulting from shared resources are tested. Furthermore, program and data used as a substitute of the processor must be prepared, only for carrying out the testing and debugging, in order to compensate for operations of other processors.

In the method shown in FIG. 4 in which a plurality of simulators are made operative at the same time, the simulator manager defines the relationship between the communication path and the simulator for each processor. Therefore, communication cannot be achieved directly between simulators but through the simulator manager. In addition, the bus simulator and the simulator manager must be prepared.

SUMMARY OF THE INVENTION

The present invention is intended to provide a multi-processor simulation apparatus capable of simulating the process of a single processor and the communication process between processors at the same time.

A multi-processor simulation apparatus according to the present invention includes a simulator preparation portion for preparing a plurality of simulators, each of which operates independently of the others, to simulate the internal process which each of processors to be simulated conducts independently of the others, and the communication process between processors at the same time, and an identification information adding portion for adding identification information, which is related to corresponding communication sites and which is needed for the simulation of communication process, to the plurality of simulators prepared by the simulator preparing portion.

The process of a single processor can be simulated because each simulator operates independently of the others. At the same time, the communication process between processors can also be simulated because simulators can identify their corresponding communication site using the holding identification information.

Further, the multi-processor simulation apparatus includes a communication simulating portion for enabling a plurality of simulators prepared by the simulator preparing portion to simulate the communication processes.

The simulation of communication processes is carried out relative to synchronous communication process in which a simulator transmits the contents of communication process to the other simulator and asynchronous communication process in which it informs the other simulator of the start of synchronous communication process.

The simulation of communication process is carried out directly between simulators or through a process which is operated independently of the simulators.

In the above-described multi-processor simulation apparatus, each simulator can simulate the operation of each of those processors in the multi-processor system which are to be simulated, while ignoring what type of processor it is. In addition, the connecting operation between processors can also be simulated by synchronous and asynchronous communication processes.

BRIEF DESCRIPTION OF THE DRAWINGS

FIG. 8 shows a case of the present invention where simulators communicate with each other through a process;

FIG. 9 is a flow chart showing the communication process between simulators in the present invention;

DETAILED DESCRIPTION OF THE PREFERRED EMBODIMENTS

Some embodiments of the present invention will be described in detail with reference to the accompanying drawings.

Explanation of the Principle

Figure 1:
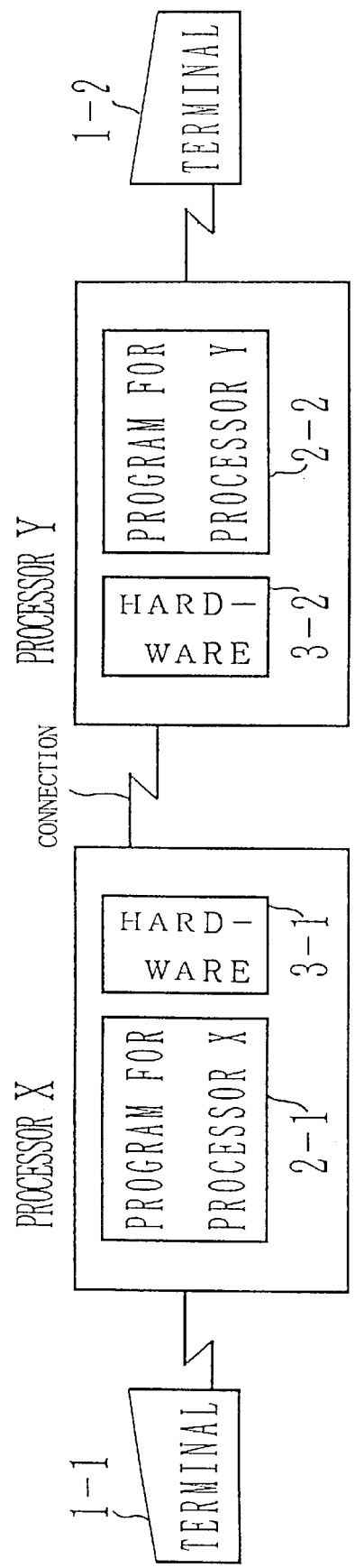
FIG. 1 shows a conventional testing and debugging method which is carried out using actual devices.
Figure 2:
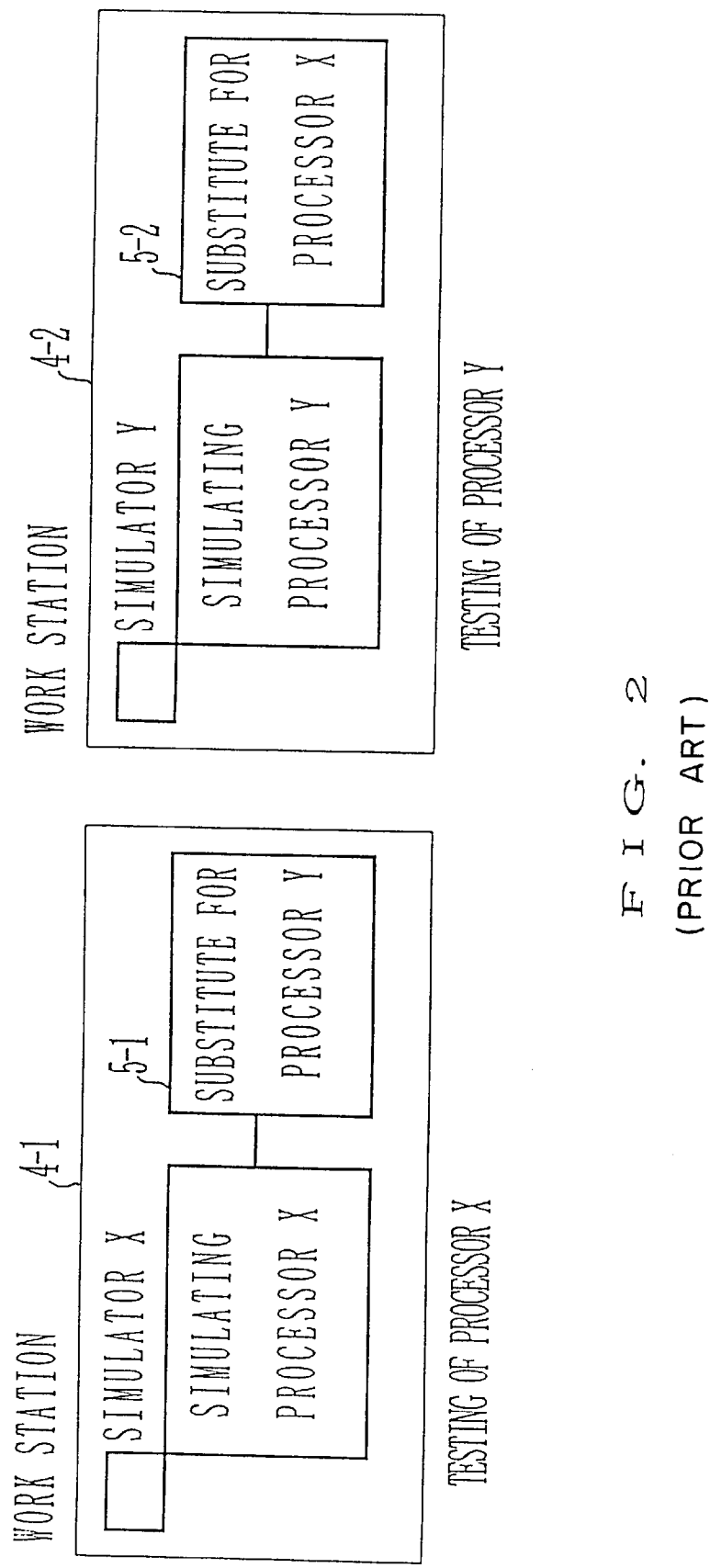
FIG. 2 shows a conventional simulation method by which processor substitutes are used.
Figure 3:
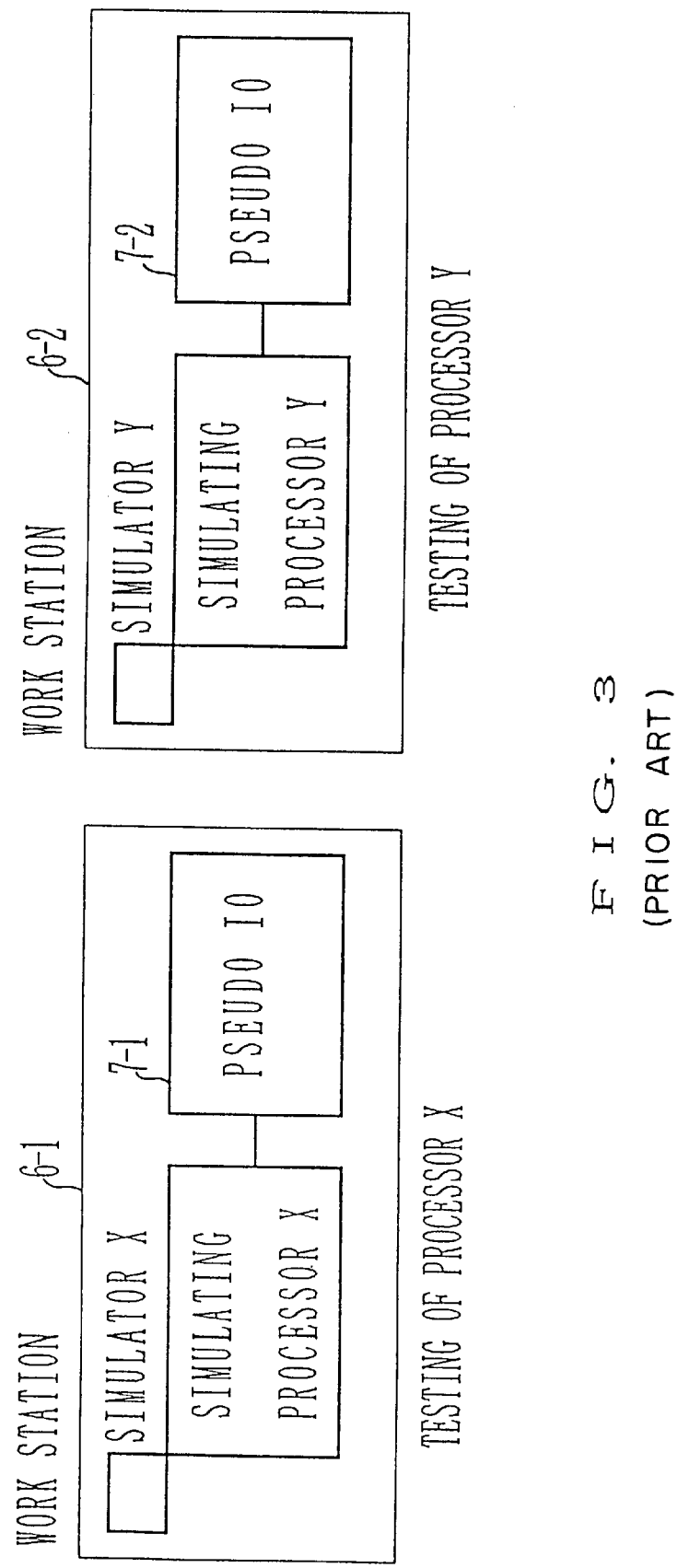
FIG. 3 shows another conventional simulation method by which pseudo IOs are used.
Figure 4:
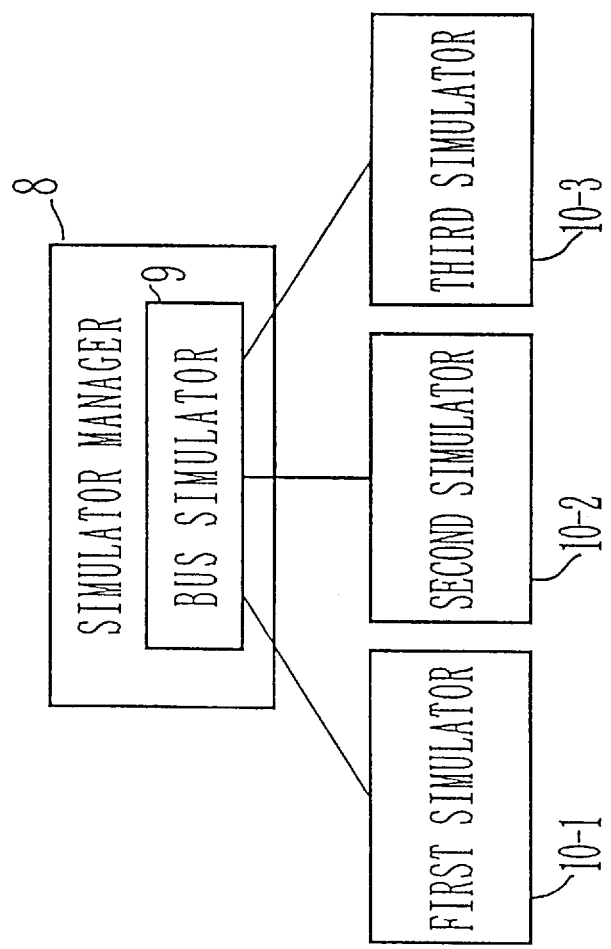
FIG. 4 shows a further conventional simulation method which is carried out through a simulator manager.
Figure 5:
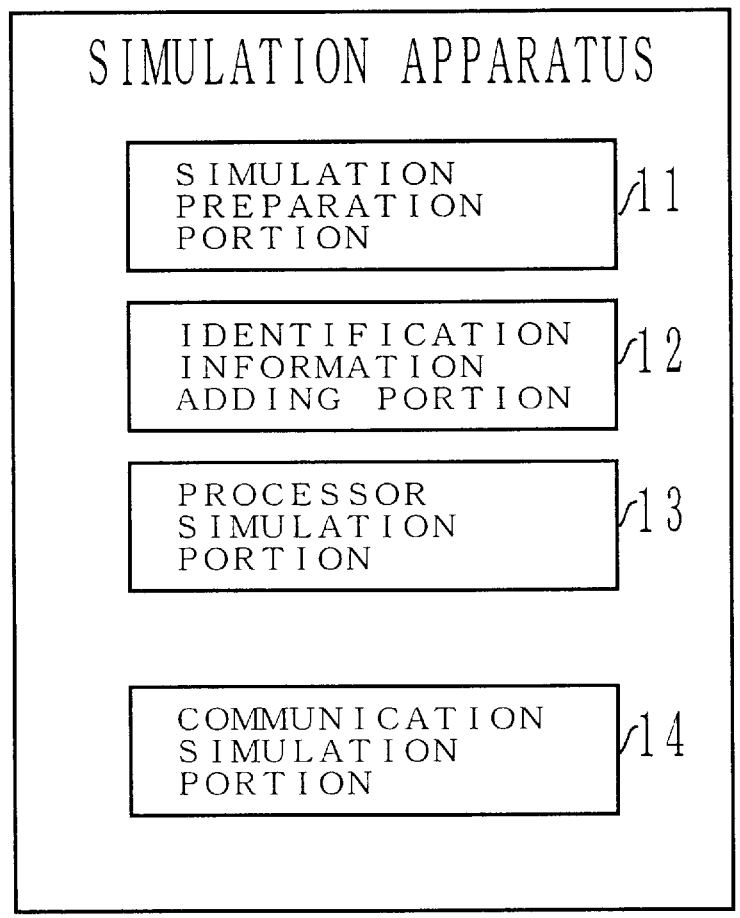
FIG. 5 shows the principle arrangement of a simulation apparatus according to the present invention.

FIG. 5 shows the principle arrangement of a multi-processor simulation apparatus according to the present invention, capable of simulating a system in which a plurality of processors are connected to one another and operated at the same time. The simulation apparatus includes a simulator preparation portion 11, an identification information addition portion 12, a processor simulation portion 13 and a communication simulation portion 14.

The simulator preparation portion 11 prepares a plurality of simulators, each of which operates independently of the others, to simulate the operation of each processor. The identification information addition portion 12 adds identification information, which is necessary to simulate a communication process achieved between one processor and the others and which is related to communication mate of the processor, to each of the simulators thus prepared.

The communication simulation portion 14 causes each simulator to simulate the communication process. The processor simulation portion 13 causes each simulator to simulate an internal process which each processor carries out independent of the communication process. The processor and communication simulation portions 13 and 14 are associated with each other at this time to enable each simulator to simulate the communication and internal processes at the same time.

The simulator preparation portion 11 is effected when the processor in a work station is used, said work station having an OS (operating system) capable of preparing a plurality of processes, each of which is operated independently of the others, at the same time.

The identification information addition portion 12 can be effected through communication function achieved between master- and sub-processes in the plurality of processes prepared by the OS, for example.

The processor simulation portion 13 is effected when a program which is to be actually executed by each processor simulated is executed by each simulator prepared on the work station.

The communication simulation portion 14 is realized when a program is prepared for every simulator to simulate the communication process and it is executed, if necessary, on the work station.

The plurality of simulators prepared by the simulator preparation portion operate independently of the others.

Accordingly the integrity of each simulator can be maintained. When each simulator loads and executes its program in parallel, therefore, the system or multi-processor system in which the plurality of processors operate at the same time can be simulated. This makes it unnecessary to carry out testing and debugging of every program for each processor.

Further, each simulator has identification information relating to its communication mates. The simulation of communication process can thus be attained between two optional simulators. This makes it unnecessary to provide a specific control portion such as the simulator manager which has identification information relating to all simulators and which controls communication simulations.

Furthermore, the processor and communication simulation portions 13 and 14 enable each simulator to simulate communication and internal processes at the same time. Communication and internal process portions of a program for each processor can be thus tested and debugged at the same time. This makes it unnecessary to produce a test program such as the processor substitute or the pseudo IO.

No process delay is caused because no actual device is used. The subtle timing of connections between processors which is difficult in the case of actual device testing can be tested.

Preferred Embodiments

Figure 6:
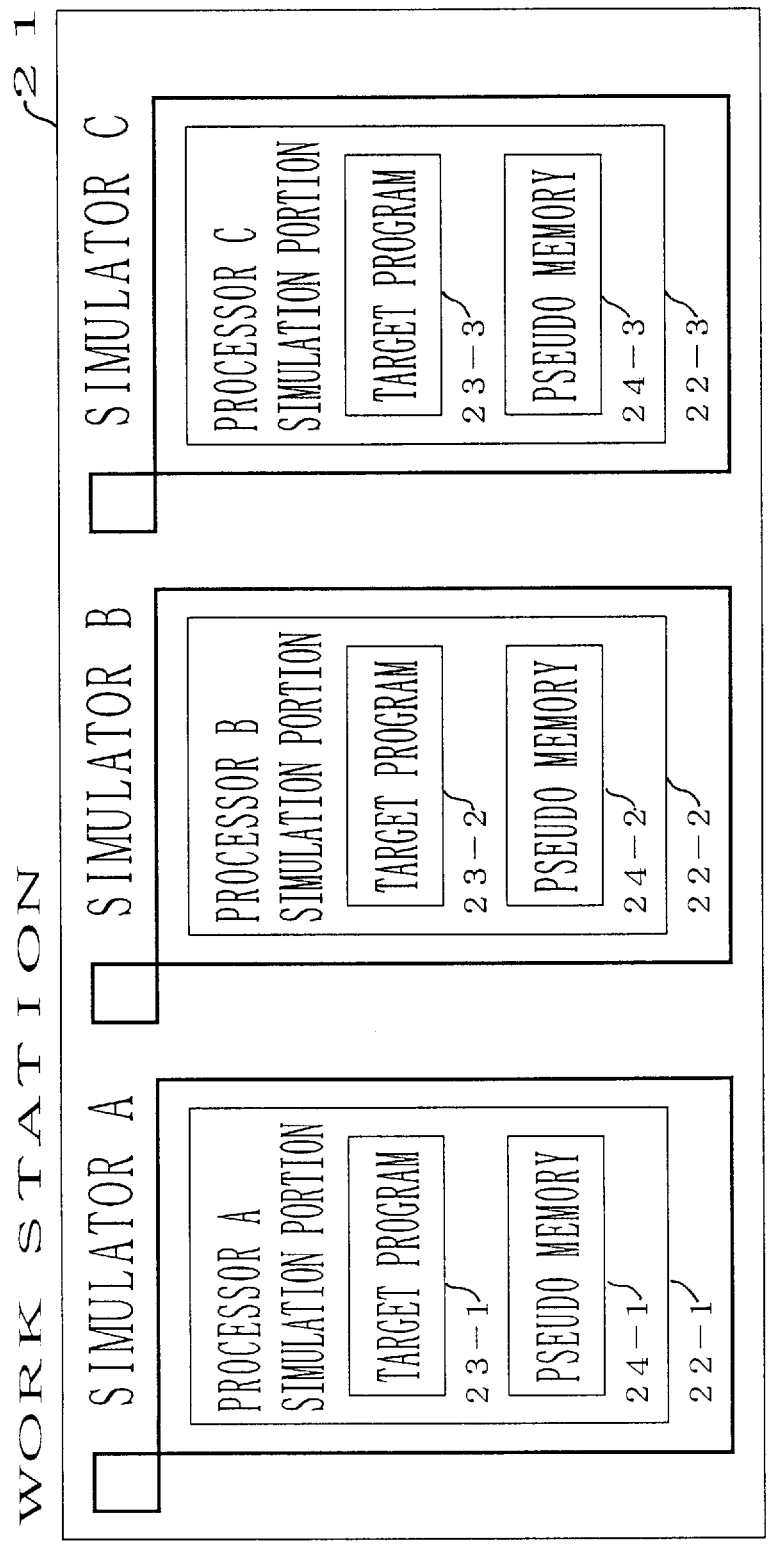
FIG. 6 shows an example of the simulation apparatus according to the present invention.

FIG. 6 shows an example of the simulation apparatus according to the present invention. In the case of this apparatus shown in FIG. 6, simulators A, B and C which simulate processors A, B and C, are parallel-operated at the same time on a same platform (work station 21). The simulators A, B and C are prepared by a multi-process function provided by an OS (operating system) such as the UNIX system. The OS initially starts the simulator A, which prepares and starts the simulators B and C as sub-processes.

When a plurality of simulators are prepared in this manner by the multi-process function, it is not necessary for the user to take the changeover of processes into consideration because the preparing and starting of each process are made by the system. In addition, each simulator thus prepared can operate independently of the others.

A processor A simulation portion 22-1 of the simulator A has a pseudo memory 24-1 to simulate an memory area of the processor A and holds a target program 23-1 to be tested and debugged. Similarly, processor simulation portions 22-2 and 22-3 of the simulators B and C have pseudo memories 24-2 and 24-3 and hold target programs 23-2 and 23-3.

Target programs 23-1, 23-2 and 23-3 are intended for processors A, B and C which are actually loaded and operated on the multi-processor system.

The processors which form the multi-processor system are usually different from one another in type and they are also therefore different from one another in clock frequency and register arrangement. But there is no problem in carrying out simulation because each simulator which corresponds to each of these processors operates independently of the others. The arrangement of clocks and registers which are used by each simulator this time is defined to meet each processor to be simulated.

The arrangement of simulators and the communication method shown in FIG. 6 will be described referring to FIGS. 7, 8 and 9. The same components and parts of processes in FIGS. 7 and 8 as those in FIG. 6 are denoted by same reference numerals.

The simulators A and B have processor A and B simulation portions 22-1, 22-2, command execution portions 25-1, 25-2 and communication portions 26-1, 26-2. The processor A and B simulation portions 22-1 and 22-2 have program loading/execution portions 27-1, 27-2, pseudo memories 24-1, 24-2 and communication start trigger detection portions 28-1, 28-2. The pseudo-memories 24-1 and 24-2 have shared memories 29-1 and 29-2.

The command execution portions 25-1 and 25-2 have communication start trigger detection portions 30-1, 30-2 and other command execution portions 31-1, 31-2, and the communication portions 26-1 and 26-2 have between-simulators asynchronous communication portions 32-1, 32-2, between-simulators synchronous communication portions 33-1, 33-2, process asynchronous communication portions 34-1, 34-2 and process synchronous communication portions 35-1, 35-2.

The program loading/executing portion 27-1 of the simulator A loads and executes the target program 23-1 which is made for the processor A. The program loading/executing portion 27-2 of the simulator B similarly loads and executes the target program 23-2. When the communication start trigger detection portion 28-1 detects a portion at which the processors A and B are needed to connect to each other, that is, a communication process portion between the processors in the course of executing the target program 23-1, the simulator A simulates the connection between the processors, while synchronizing and communicating with the independently-operating simulator B. The synchronization can be achieved between the processors this time by causing the simulator A to communicate directly with the simulator B, or indirectly with it through a process.

Figure 7:
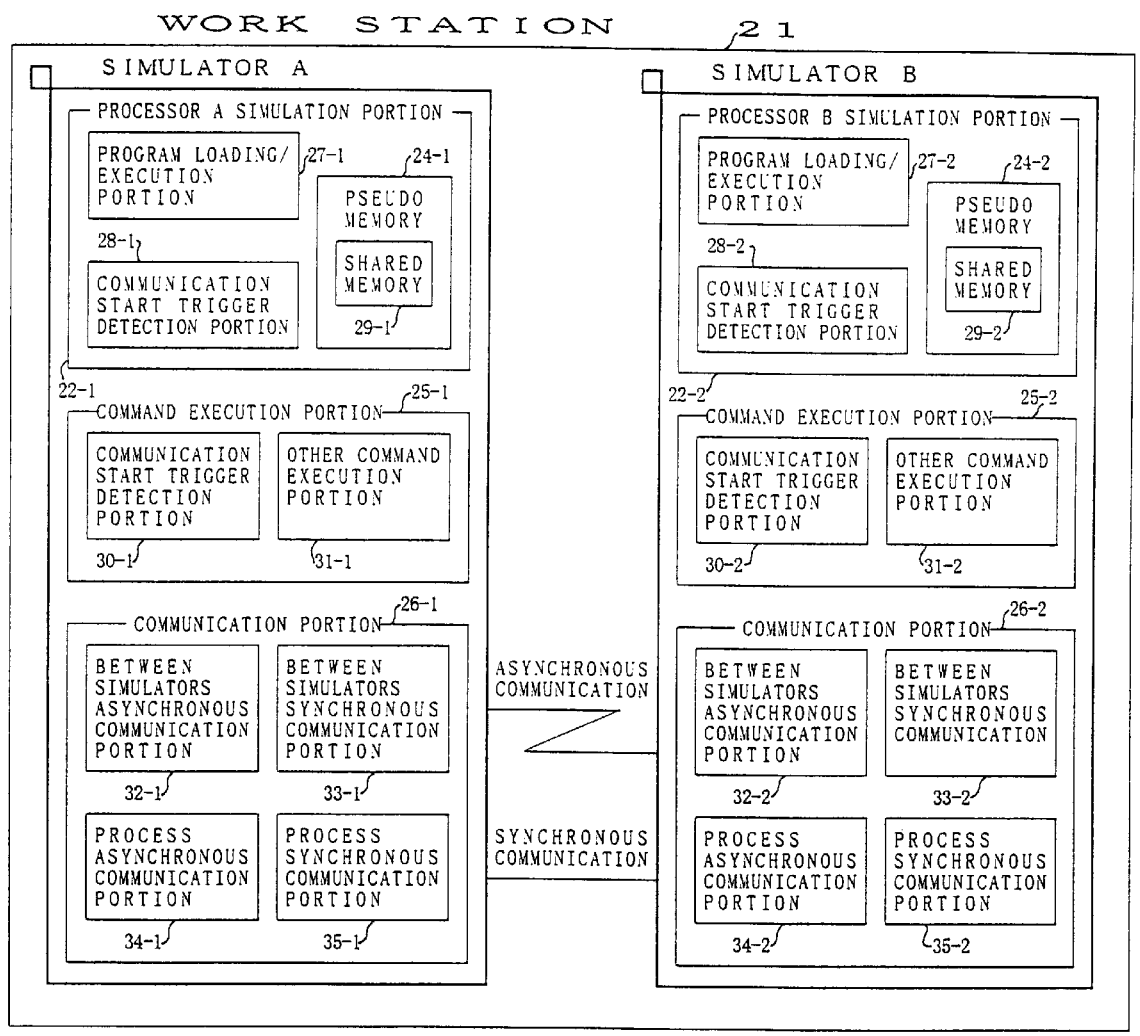
FIG. 7 shows a case of the present invention where simulators communicate directly with each other.

FIG. 7 shows a case where two simulators communicate directly with each other. The simulator A uses the between-simulators synchronous communication portion 33-1 at this time, to transmit detailed connection contents to the between-simulators synchronous communication portion 33-2 of the simulator B, and then uses the between-simulators asynchronous communication portion 32-1 to inform the between-simulators asynchronous communication portion 32-2 that it wants to start synchronous communication.

This between-simulators synchronous communication can be realized by a message communication function of between-processes communications provided by the UNIX, for example. Further, the between-simulators asynchronous communication can be realized by a signal communication function provided by the same UNIX system. This signal in the UNIX system is a type of software interruption made into the currently executing process, and it can be forcedly received by writing on-information into its flag.

The communication start trigger detection portion 28-2 of the simulator B keeps watch for whether or not other simulators ask to start communication. When so asked, the simulator B uses the between-simulators synchronous communication portion 33-2 to receive connection contents transmitted from the between-simulators synchronous communication portion 33-1 of the simulator A, identifies its connecting mate simulator and the detail of connection contents, and carries out a connecting process on the basis of the results thus identified.

Generally, detailed information cannot be transmitted by the signal communication function. Connection contents, therefore, are transmitted to the simulator B by message communication when it is in a receiving condition. When it receives a signal from the simulator A and its condition becomes possible to receive a message, synchronization is established between both of the simulators.

FIG. 8 shows a case where two simulators communicate with each other through a process. The process 41 shown in FIG. 8 is prepared as a subprocess by the simulator A and it can be called from both of the simulators A and B. It has a simulator communication portion 42, a communication trigger processing portion 45, a shared memory supervisory portion 46 and a process treatment portion 48. The simulator communication portion 42 has a asynchronous communication portion 43 and a synchronous communication portion 44. The communication trigger processing portion 45 has trigger setting portion 45-1 and trigger watching portion 45-2 and the shared memory supervisory portion 46 has a shared memory 47.

In this case, the simulator A transmits connection contents to the process 41 through the process synchronous communication portion 35-1 and then informs it through the process asynchronous communication portion 34-1, that the simulator A wants to start synchronous communication.

The process 41 keeps watch, through the communication trigger processing portion 45, for whether or not a communication start request is made from the simulators A, B and others, and when it detects a communication start request, it receives connection contents transmitted from the simulator A through the synchronous communication portion 44 and confirms the connecting mate simulator, the detail of connection contents and the object to which connection contents are to be transmitted. When it has confirmed that the object is the simulator B, it transmits connection contents to the simulator B through the synchronous communication portion 44, and informs it through the asynchronous communication portion 43 that it wants to start synchronous communication.

The simulator B keeps watch, through the communication start trigger detection portion 28-2, for whether or not a communication start request is made by the process 41, and when it detects a communication start request, it receives connection contents transmitted from the process 41 through the process synchronous communication portion 35-2. It confirms the connecting mate process 41 and the detail of connection contents, and it carries out connection process. The process treatment portion 48 of the process 41 simulates, at this time, the connecting operation between the hardware of the processors A and B. In a case where the processors A, B, C - - - are connected through a common bus, for example, the process treatment portion 48 simulates connection through this common bus.

In the case of FIG. 8, too, synchronous and asynchronous communications between each simulator and the process 41 can be realized by message and signal communication functions of the UNIX, for example.

FIG. 9 is a flow chart showing communication process between simulators in a case where both the direct communication shown in FIG. 7, and the indirect communication shown in FIG.8, are used.

When the simulator in this example loads the target program and starts its pseudo execution, it retrieves a command from the target program and executes it (step S1). When this one command execution is finished, it is checked whether or not asynchronous communication is received externally (step S2). The signal flags are checked in this case, for example. When it is found, as the result, that asynchronous communication has been made to request the start of synchronous communication, it is confirmed if the mate from which the synchronous communication has been transmitted is another simulator or a process (step S5).

When it is found at the step S5 that the mate which has requested to start synchronous communication is the other simulator, the synchronous communication with the transmission source simulator is started (step S7). When the synchronous communication thus started is finished, it is checked whether or not other asynchronous communication is received (step S2).

When it is found at the step S5 that the mate which has requested to start the synchronous communication is not the other simulator but a process, the synchronous communication with the process is started (step S6). When the synchronous communication thus started is finished, it is again checked whether or not other asynchronous communication is received (step S2).

When it is found at the step S2 that no asynchronous communication is received or that all of asynchronous communications received have been finished, it is confirmed whether or not the result obtained while executing the command at the step S1 corresponds to the communication start trigger (step S3). This is confirmed by the communication start trigger detection portions 28-1 and 28-2. When a communication start trigger is detected, the communication object required is specified (step S8).

When the communication object or mate is the other simulator, communication process data are transmitted to the communication object or simulator by synchronous communication and the object simulator is requested to start the synchronous communication by asynchronous communication (step S11). When the object simulator confirms that it has received the asynchronous communication and responds to it by synchronous communication, synchronous communication between the simulators is started (step S12). When the synchronous communication thus started is finished, it is then confirmed whether or not a new communication start trigger is generated (step S3).

When the communication mate is the process, contents of communication process are transmitted to the process by synchronous communication and the process is requested to start the synchronous communication by asynchronous communication (step S9). When the process confirms that it has received the asynchronous communication and it responds to it through synchronous communication, synchronous communication between the simulator and the process is started (step S10). When the synchronous communication thus started is finished, it is then confirmed whether or not a new communication trigger is generated (step S3).

When it is not detected at the step S3 that the communication start trigger is generated, or it is found at the step S3 that the communication process which has been in response to the communication start trigger detected is finished, it is confirmed whether or not pseudo execution is to be finished (step S4). If any commands remain at this time in the target program to be executed, a next command is retrieved and executed (step S1). When it is found that all commands have been executed and finished, pseudo execution is ended.

All of the simulators each corresponding to each of the processors carry out this between-simulators communication process.

Figure 10:
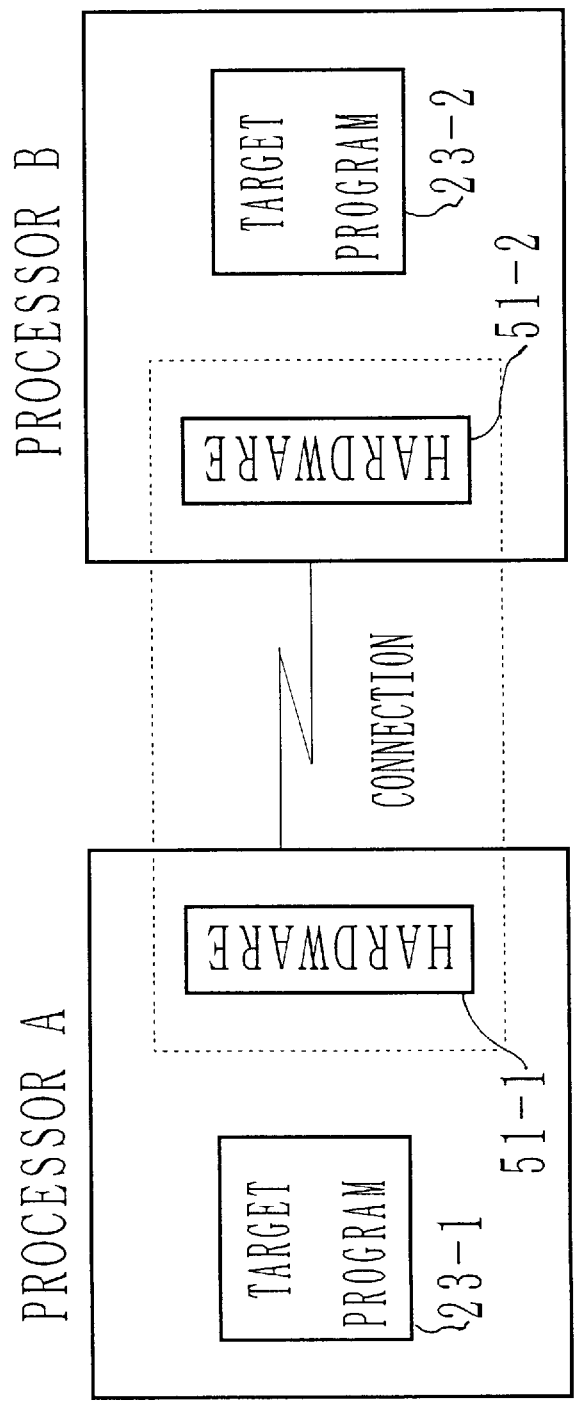
FIG. 10 shows the connecting operation between processors.

FIG. 10 shows the connecting operation between processes in the actual multi-processor system. Processors A and B shown in FIG. 10 have communication hardware 51-1 and 51-2, through which they are connected to each other. The processor A executes its target program 23-1 and when it is required that the processor A communicates with the processor B, the processor A is connected to the hardware 51-2 of the processor B through the hardware 51-1.

The simulation of this connecting operation between processors by the simulation apparatus can be achieved by the execution of simulator commands, by the shared memories or by the transmission of simulator information. These connection processes can be carried out, not dependent on whether the communication method at the simulation time is by direct communication between simulators or by indirect communication through a process.

Figure 11:
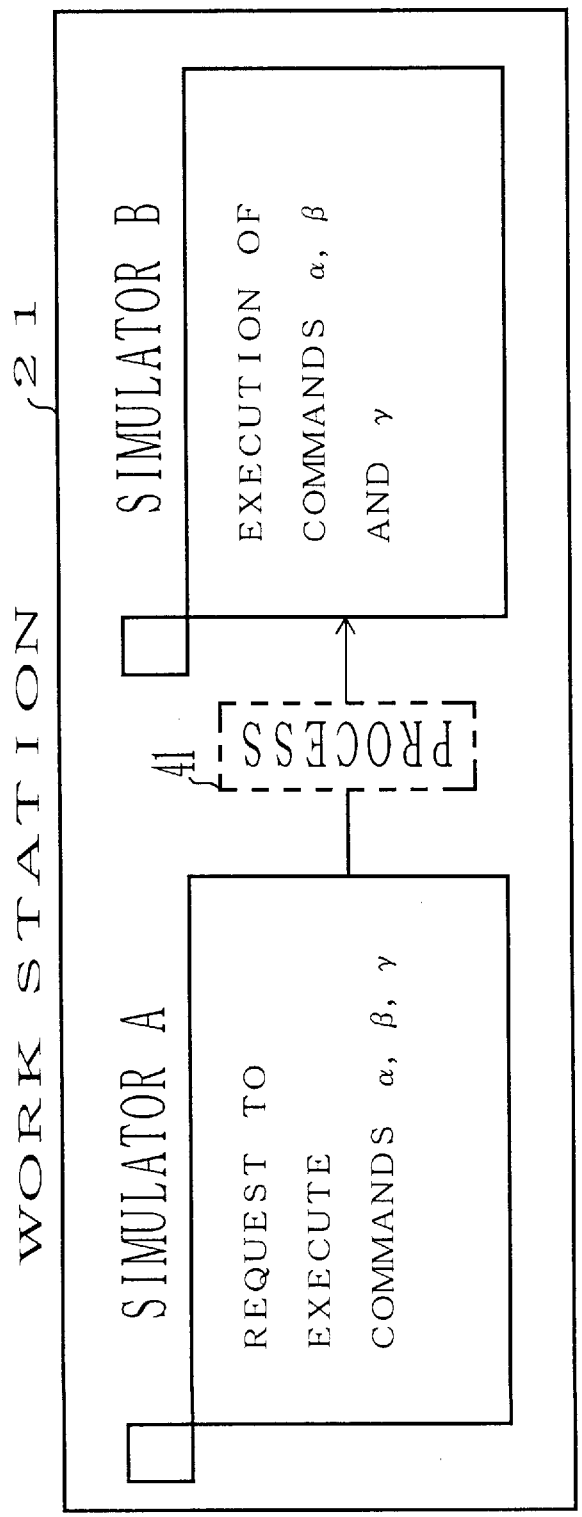
FIG. 11 shows the connecting process achieved when commands are carried out in the present invention.

FIG. 11 shows the connection process achieved by the execution of simulator commands. The simulator A requests the simulator B to execute commands α, β and τ by the direct communication or by the indirect communication through a process. The commands α, β and τ are simulator commands representing initializing, program loading, memory mapping, starting of simulation by the program loaded, interruption setting, break point setting, memory reference and update, register reference and update, logging, command file execution, setting of communication start trigger, preparing and executing of process, and others. The simulator B simulates the connection between processors A and B while executing the commands α, β and τ, transmitted from the simulator A through the command execution portion 25-2.

Figure 12:
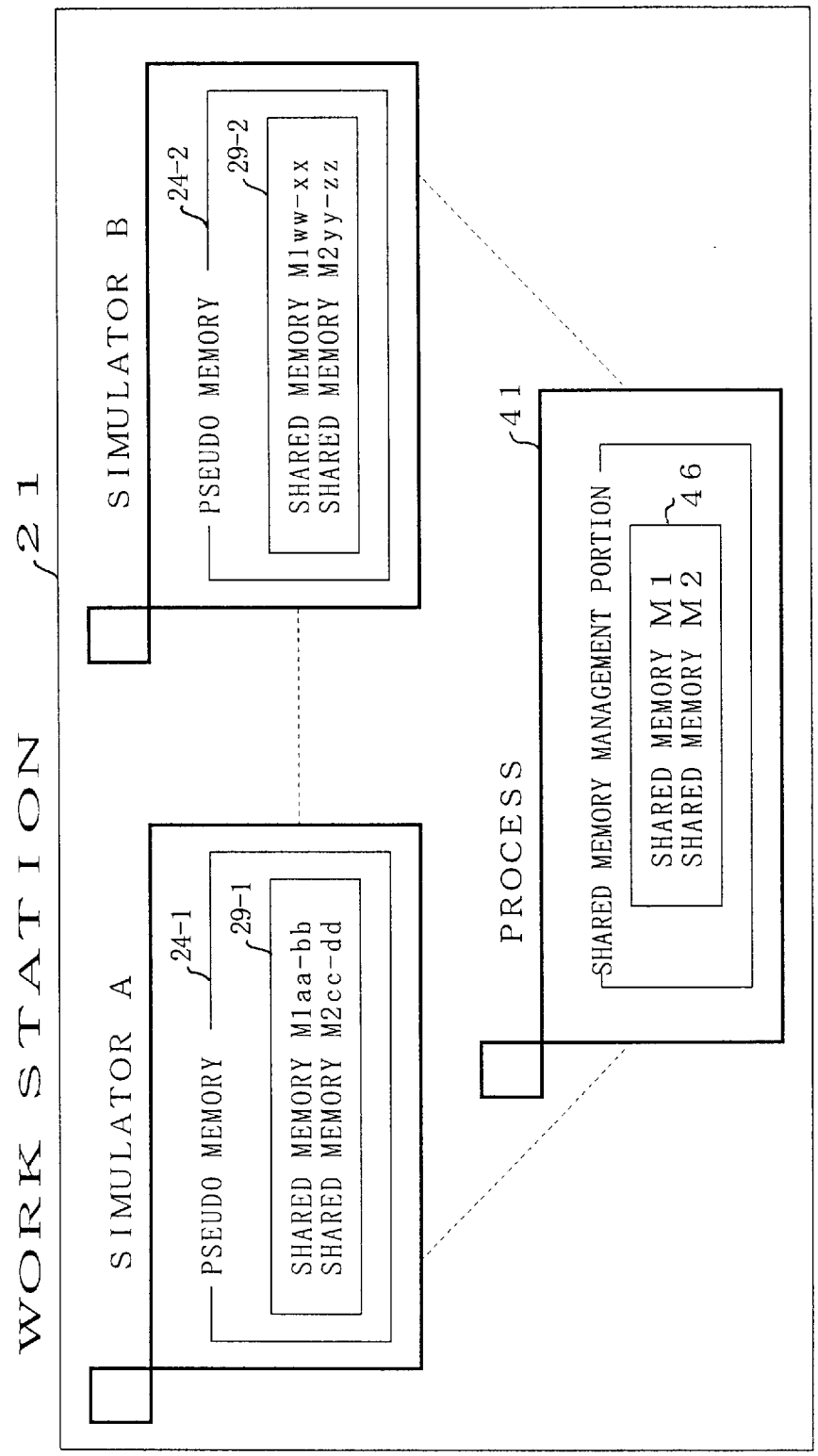
FIG. 12 shows the connecting process achieved by shared memories in the present invention.

FIG. 12 shows the connection process attained by the shared memories. Common access can be gained to shared memories M1 and M2 by the simulators A and B, and the storing areas of shared memories are mapped in the pseudo memories 24-1 and 24-2 of the simulators A and B. The shared memory supervisory portion 46 of the process 41 supervises the shared memories M1 and M2. When data are written in the shared memory M1 or M2 by the simulator A, for example, the simulator B can use this written data immediately. This connection process by the shared memories can be effected by the shared memory function provided by the UNIX system, for example.

Figure 13:
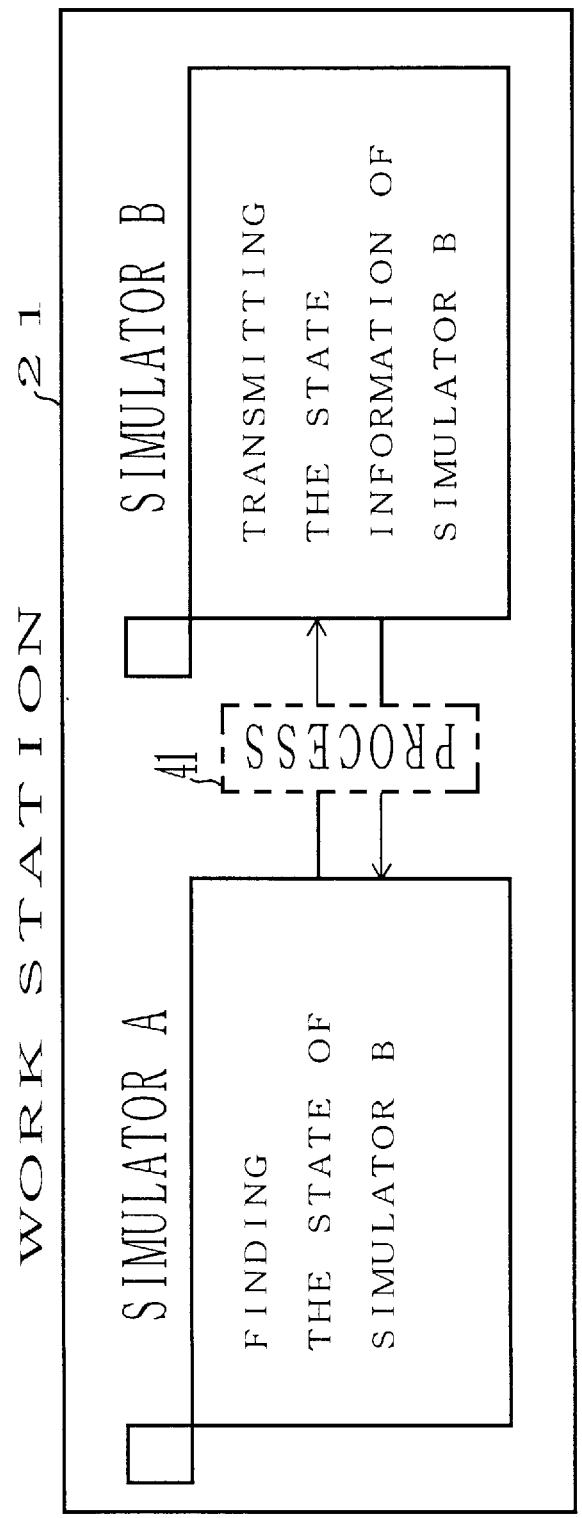
FIG. 13 shows the connecting process achieved by the transmission of simulator information in the present invention.

FIG. 13 shows the connection process attained by the transmission of simulator information. The simulator A informs the simulator B by the direct communication or by the indirect communication through the process 41 about the condition of the simulator B. In response to the contents of communication transmitted from the simulator A, the simulator B transmits its condition and other information to the simulator A by the direct communication or by the indirect communication through the process 41.

When the three kinds of above-described connection processes are combined with one another and a process is prepared to carry out calculations, condition confirmation and treatment by OS resources, a more complicated connection, as seen in the case of actual devices, can be simulated.

According to the present invention as described above, synchronization between simulators can be established to simulate the connection process only when processes characteristic of the multi-processor system are required, that is, when communications between processors are required. The integrity of each simulator can be kept because each simulator operates independently of the others. Further, the complicated connection process in the multi-processor system can be prepared as a queue of simulator commands by the user. Or the user can prepare the contents of the process treatment portion 48 to simulate this complicated connection process by the process 41.

A more specific operation of the simulation apparatus according to the present invention will be described with reference to FIGS. 14 through 21.

In FIGS. 14 through 21, the simulation apparatus according to the present invention can be effected by a work station on which the UNIX system is loaded. Signal communication function is used as asynchronous communication, and message communication function is used as synchronous communication between the simulators or between the simulator and the process. The simulation apparatus according to the present invention, however, may also be effected by other systems which are similarly provided with between-processes communication functions.

Figure 14:
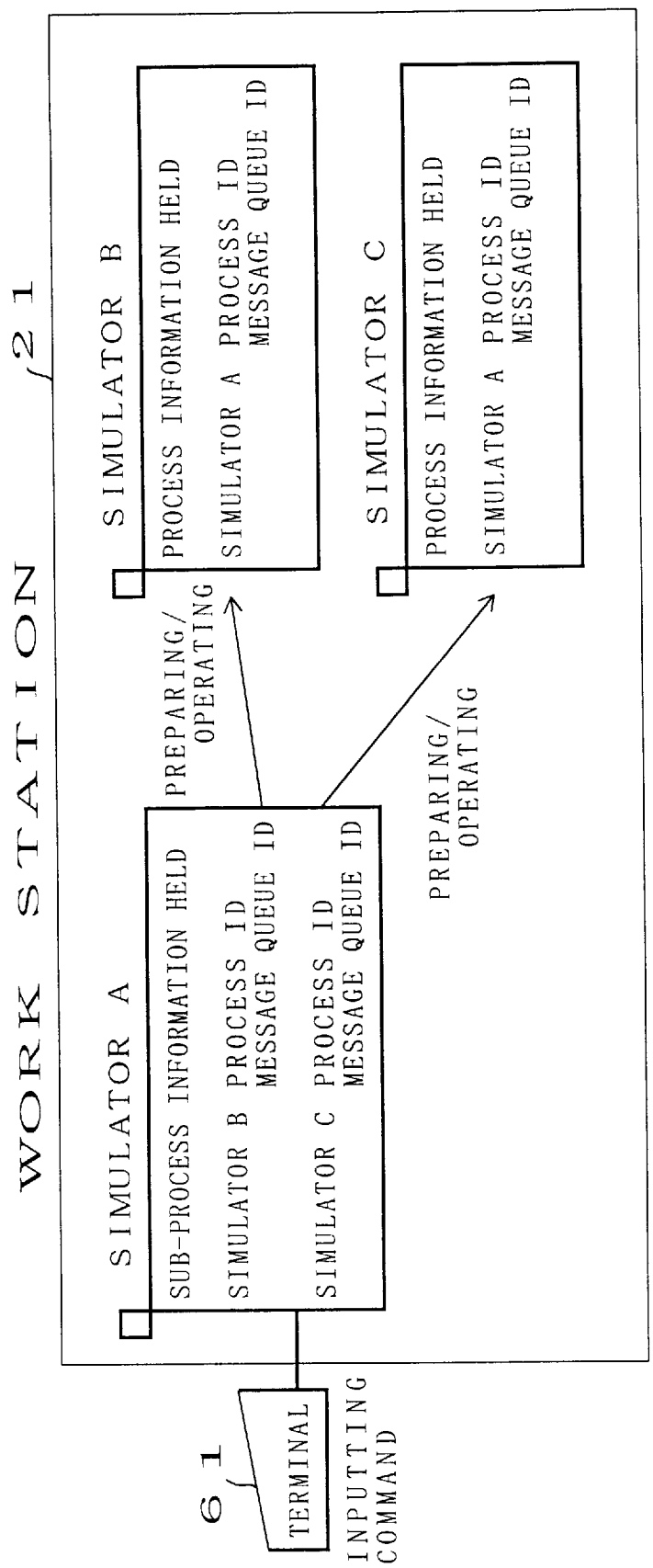
FIG. 14 shows how simulators are started in the present invention.

FIG. 14 shows how a plurality of simulators are started on the simulation apparatus. The simulator A is started first, through a terminal 61. When it is started, a command for requesting the start of multi-processor simulation is put into it through the terminal 61. The multi-process function of the work station 21 is made operative in response to this command, and the simulator A prepares and operates the simulator B as a sub-simulator (or sub-process). It also prepares and operates the simulator C and others (not shown) as sub-processes. It serves, therefore, as a master simulator (or master process) for the simulators B, C and others.

Under multi-process circumstances, processes which are in master- and sub-relationships can usually have process identifiers (or process IDs) to identify one another, and these process IDs are used at the time of signal communication. In FIG. 14, the simulator A has process IDs for the simulators B and C, each of which has process ID for the simulator A.

Further, the simulator A gains a queue identifier (or queue ID) for the message communication with the simulator B, while using a system call to gain the queue ID, and it informs the simulator B of this queue ID as a parameter when it makes the simulator B operative. The simulator B holds the queue ID thus informed for the message communication associated with it. Similarly, a queue ID which is used for the message communication between simulators A and C is stored in them. The same applies to other simulators (not shown).

Each of the sub-simulators prepared, the simulator A loads a target program for a processor to be simulated, and it executes its program independently of the others. Each sub-simulator can communicate at this time with the master simulator A by signal and message communications. The master simulator A can also communicate with all of the prepared sub-simulators. Under this state, however, the sub-simulators prepared by the master simulator A cannot communicate with one another. The simulator A, therefore, transmits to each sub-simulator the information about all sub-simulators it has prepared.

Figure 15:
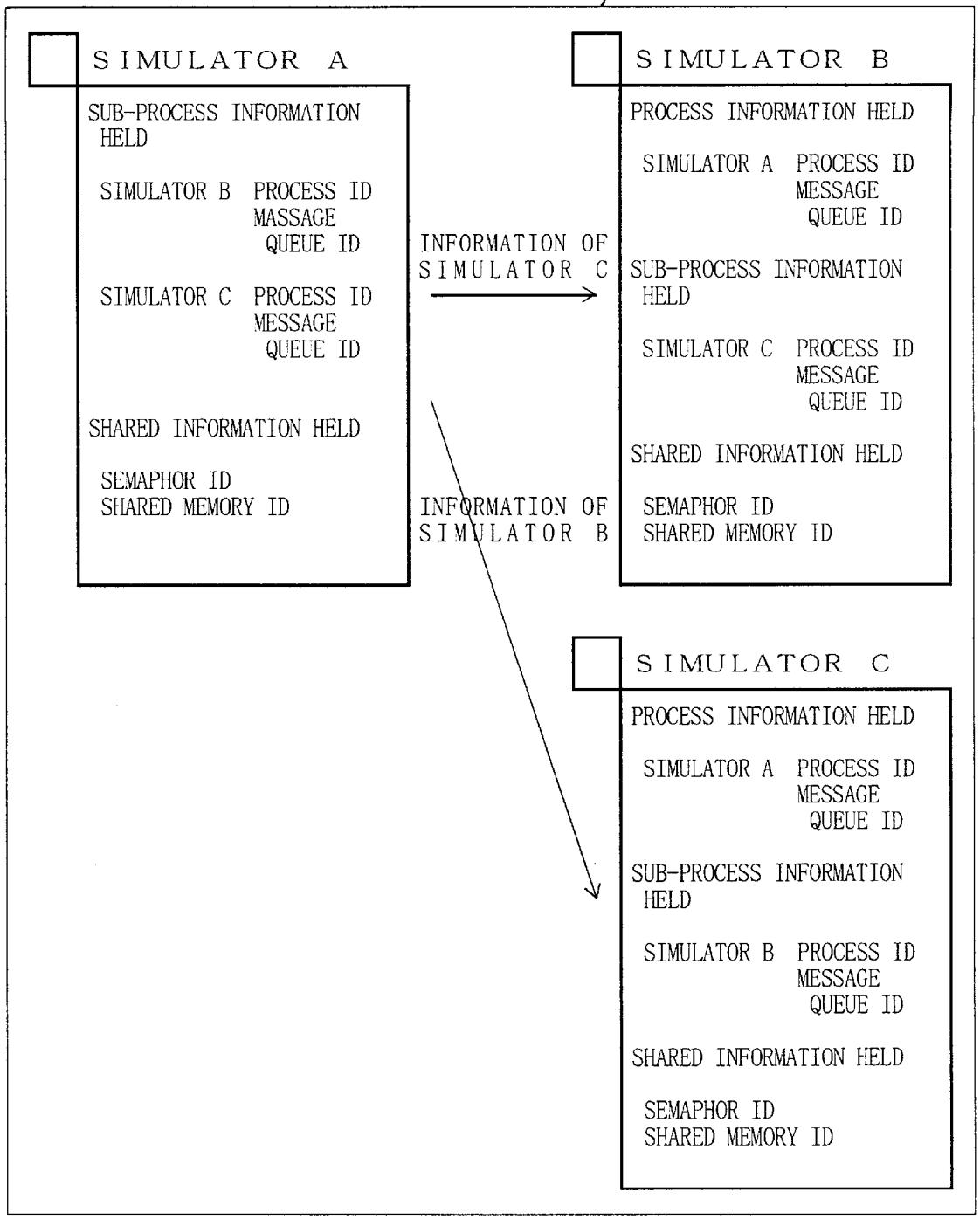
FIG. 15 shows information that simulators have in the present invention.

As shown in FIG. 15, for example, the simulator A uses the queue ID for the message communication with the simulator B, to transmit the simulator B, as a message, the information of process and message queue IDs for the simulator C. The message is thus stored in that message storing area of the simulator B which corresponds to the queue ID for the message communication. The simulator A uses the process ID of the simulator B to inform the simulator B by the signal communication that it has transmitted the message to the simulator B. The value of signal flag is thus caused to be incremented. The flag represents the number of communication requests made from other simulators relative to the simulator B.

The simulator B which is executing the target program 23-2 independently of the simulator A, checks the signal flag at all times and knows that a communication request is made from an other simulator when the value of signal flag is caused to be incremented by the signal communication with the simulator A. Using the queue ID held for the message communication with the simulator A, the simulator B receives the message transmitted from the simulator A and gains the process and queue IDs of the simulator C. When the communication process is finished, the flag is caused to be decremented and when its value becomes zero, the simulator B returns to the execution of the target program 23-2.

Similarly, the simulator A transmits the process and queue IDs of the simulator B to the simulator C. When the simulators B and C have stored their respective process and queue IDs in this manner, communication between them becomes possible.

Because shared memory and semaphore functions provided by the system can be used, the simulator A can further gain shared memory and semaphore identifiers (or shared memory and semaphore IDs) by system calls, and transmit them to each sub-simulator as seen in the case of the process and queue IDs. When all of the simulators have common shared memory and semaphore IDs in this manner, access can be gained to those common shared memories and semaphore indicated by the identifiers. If the semaphore function supervises whether or not the above-mentioned message storing area can be used, for example, the collision of message transmissions between two simulators can be avoided.

While each simulator is executing its target program, the trigger by which it starts the connection with the other processor, that is, the communication with the other simulator, is set by a command executed by the communication start trigger setting portions 30-1 and 30-2. A specific example of the trigger setting in the simulator A is shown in FIG. 16.

Figure 16:
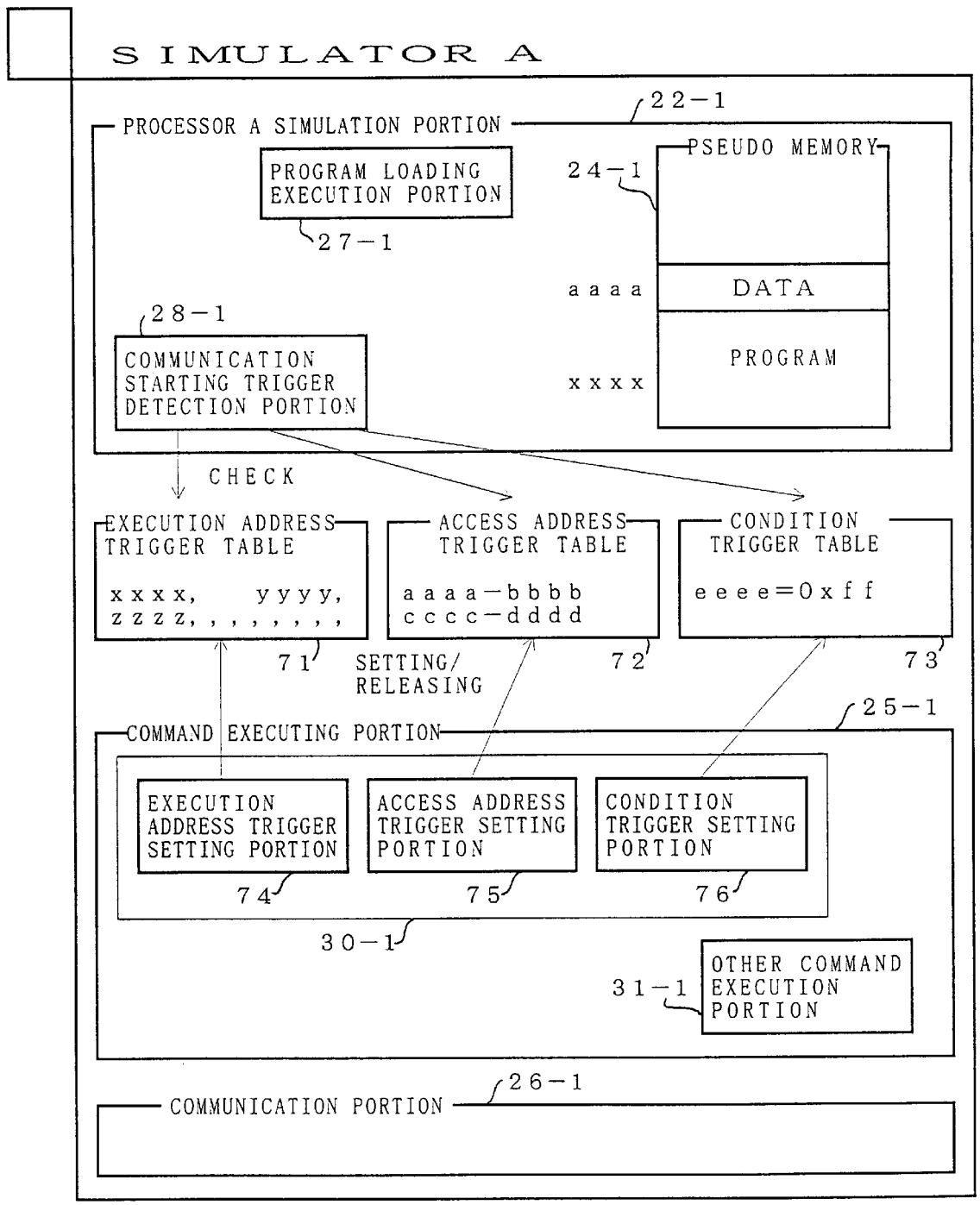
FIG. 16 shows a specific example of a communication starting trigger in the present invention.

Data and programs are stored in the pseudo memory 24-1 of the simulator A shown in FIG. 16 and the processor A simulation portion 22-1 executes the program, while using this data. The communication start trigger setting portion 30-1 of the command executing portion 25-1 includes an execution address trigger setting portion 74, an access address trigger setting portion 75 and a condition trigger setting portion 76.

The execution address trigger setting portion 74 appoints a specific program address of the pseudo memory 24-1 such as "x x x x", as a communication start trigger, and registers it in an execution address table 71. The access address trigger setting portion 75 allocates a specific range data address of the pseudo memory 24-1 ranging from "a a a a" to "b b b b" as the communication start trigger, and registers it in an access address trigger table 72.

The condition trigger setting portion 76 allocates a specific condition of the processor A as the communication start trigger, and registers it in a condition trigger table 73. In FIG. 16, for example, it is registered as the trigger condition that a data address "e e e e" becomes "0 x f f", that is, the value of data stored in the data address "e e e e" becomes "0 x f f". It may be registered, as the trigger condition, in the condition trigger table 73, that a variable becomes a specific value.

A time-out is sometimes registered, as the condition trigger, in the condition trigger table 73. The condition trigger is established in this case when a specific number of clock pulses have has passed from the timing of command execution, instruction execution or message reception from the other simulator.

The communication start trigger detection portion 28-1 checks, at all times, data stored in the execution address, access address and condition trigger tables 71, 72 and 73, while the program is being executed, and when it detects that one of them matches the communication start trigger, it asks the communication portion 26-1 to start communication. In response to this request, the communication portion 26-1 communicates directly or indirectly with the other simulator.

Figure 17:
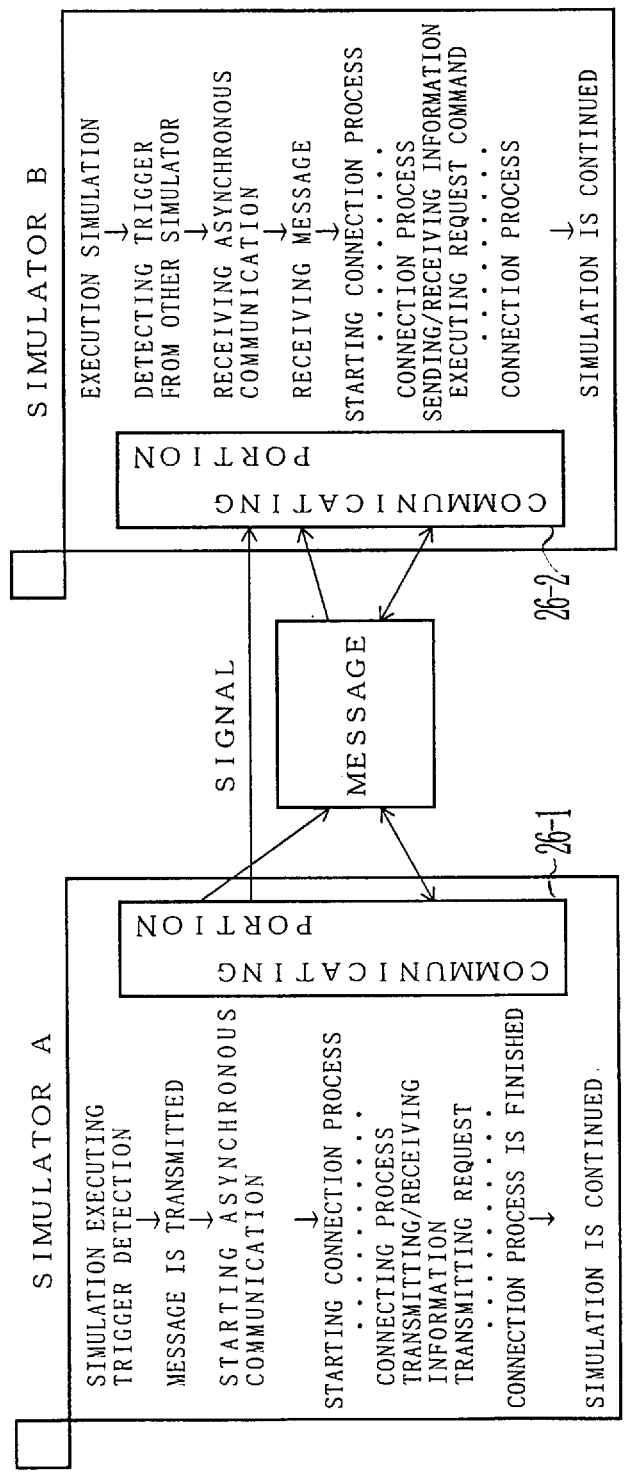
FIG. 17 shows how communication and connecting processes proceed in the present invention.

For example, the program address "x x x x" is registered in the execution address trigger table 71. When the program loading/executing portion 27-1 locates the program address "x x x x" of the pseudo memory 24-1, therefore, the communication start trigger detection portion 28-1 makes the communication portion 26-1 operative. The range of data address "a a a a"–"b b b b" is registered in the access address trigger table 72. When the program loading/executing portion 27-1 locates the data address "a a a a" of the pseudo memory 24-1, therefore, the communication start trigger detection portion 28-1 makes the communication portion 26-1 operative. Further, the data address ("e e e e" becomes "0 x f f") is registered in the condition trigger table 73. When this condition is met while the program is being executed, the communication start trigger detection portion 28-1 makes the communication portion 26-1 operative FIG. 17 shows the communication process between simulators A and B and a flow of connection processes related to the communication process.

When the simulator A detects a trigger to start the connection with the simulator B, it transmits the connection process request, as a message, to the simulator B. However, the simulators A and B operate independently of each other. The message, therefore, cannot be transmitted directly to the simulator B. To overcome this, the simulator A uses the asynchronous communication by the signal communication to inform the simulator B that the message has been received. The signal flag of the simulator B is caused this time to be incremented.

The communication start trigger detection portion of the simulator B checks the signal flag at all times. It knows, therefore, that some message has been received. Accordingly, it confirms in a table (not shown) in which information of other simulators are supervised, whether or not the message received corresponds to any of the message queue IDs stored of other simulators. As the result, it finds out that the message has been received from the simulator A and it reads out the message transmitted, from the message storing area to which the message is related. It confirms, in this manner, the connection process data and that the mate to be connected is the simulator A.

According to the connection data received, the simulator B carries out the transmission and reception of memory contents, the execution of commands requested by the simulator A, the transmission of its information and others. It uses the message communication to transmit them. When this connection process is finished, the signal flag is caused to be decremented and when the flag becomes zero, it returns to its own simulation process which was being executed before the connection process, and continues it. The simulator A also returns to its own simulation process at this time.

Figure 18:
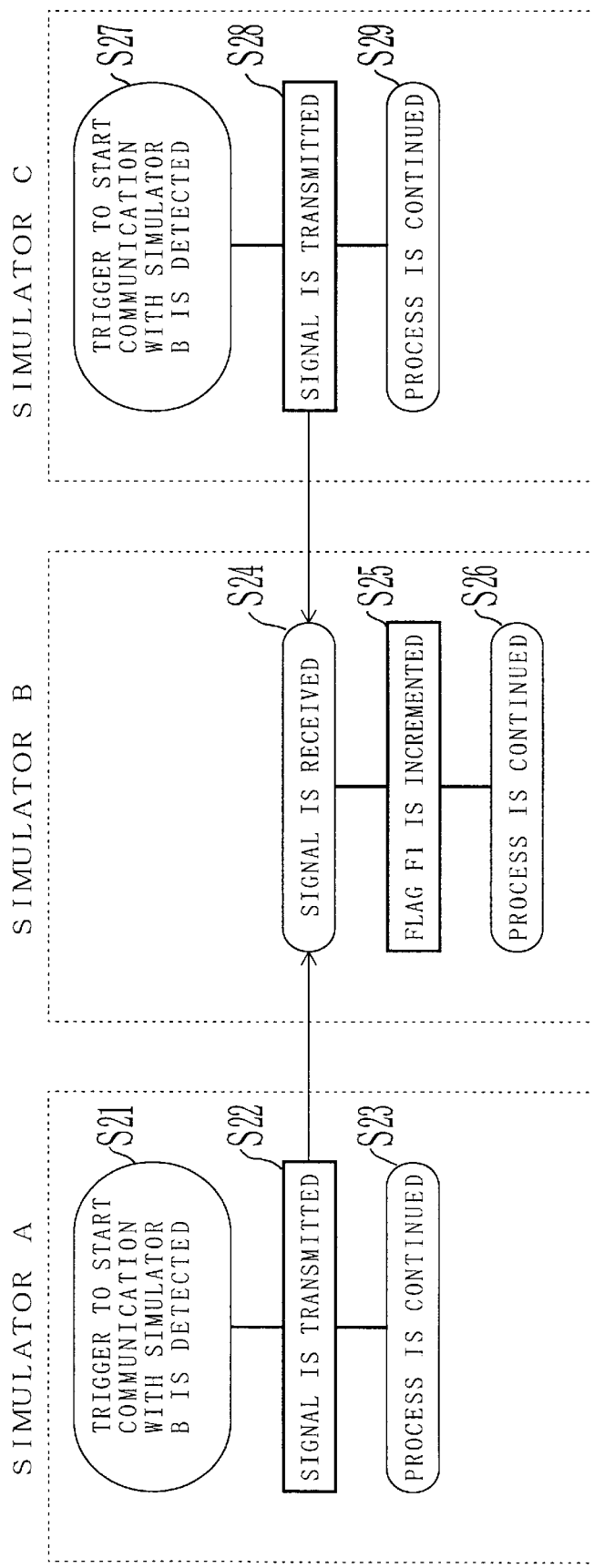
FIG. 18 is a flow chart showing the signal communication process between simulators in the present invention.

FIG. 18 is a flow chart showing signal communication process between three simulators.

When the communication start trigger to communicate with the simulator B is detected by the simulator A (step S21), the simulator A transmits the communication signal to the simulator B (step S22) and then continues the process that was being executed before the detection of the trigger (step S23).

Depending upon the contents of message transmitted to the simulator B after the communication start trigger was detected, but before the signal was transmitted, however, the simulator A is sometimes kept waiting for a message from the simulator B. When the simulator A does not know what state the simulator B is in, for example, it receives an answer message from the simulator B and then continues thee process that was being executed before the detection of the trigger. When it requests the simulator B to execute a command, however, no waiting is required.

When the simulator B receives the signal from the simulator A (step S24), it causes its flag F1 to be incremented (step S25) and continues the process that it was executing before the signal reception (step S26). The flag F1 belongs to the simulator B and represents the number of signals received from any of the other simulators. Its initial value is set to zero.

When the communication start trigger to start communication with the simulator B is detected by the simulator C (step S27), the simulator C transmits the communication signal to the simulator B (step S28) and then continues the process that was being executed before the trigger detection (step S29).

When the simulator B receives the signal from the simulator C (step S24), it also causes its flag F1 to be incremented (step S25), as seen when it receives the signal from the simulator A. The flag F1 is caused to be incremented in this manner every time a signal is received from the other simulators, even if the signal is transmitted from any simulator.

When the currently continuing process is temporarily ended, the simulator B checks the value of its flag F1, and when the value of its flag F1 is larger than 0, it transmits the message. When the message communication is finished, it causes its flag F1 to be decremented and it checks its flag F1 again. It repeats this process until the value of its flag F1 becomes zero.

Figure 19:
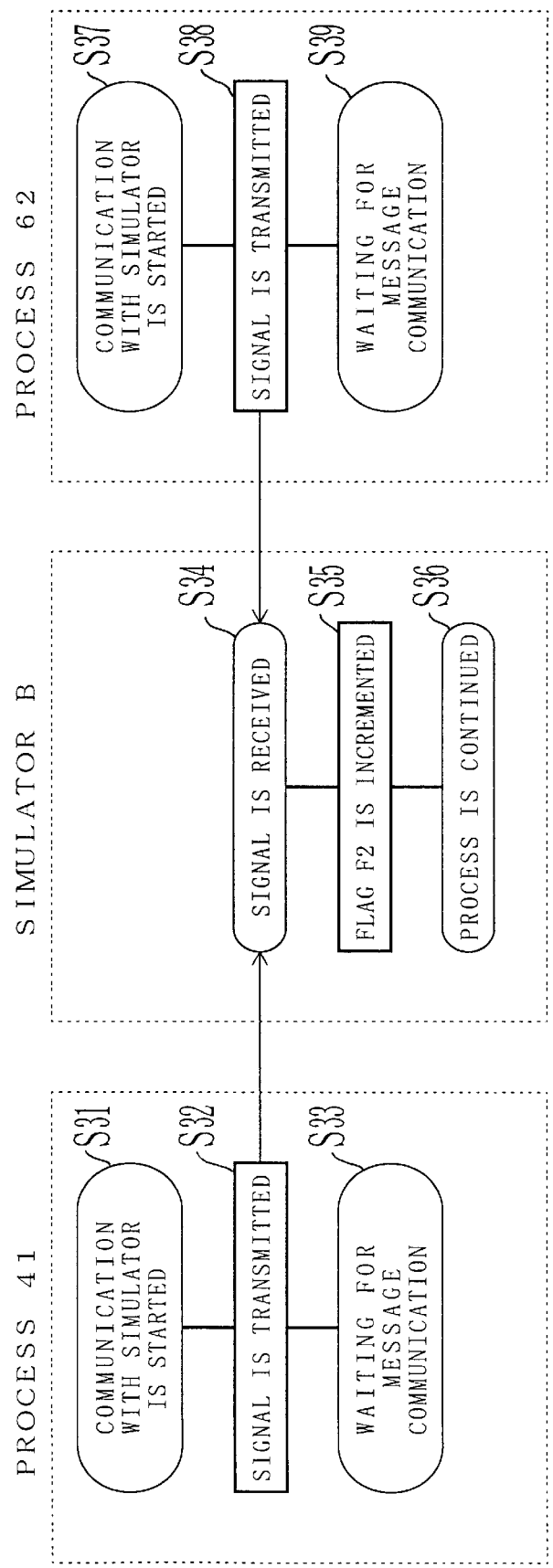
FIG. 19 is a flow chart showing the signal communication process between the simulator and processes in the present invention.

Similarly, connection process between both simulators is sometimes made by the indirect communication through a process. FIG. 19 is a flow chart showing the signal communication between the simulator B and two processes. A process 62 shown in FIG. 19 has a same arrangement as that of the process 41 shown and it serves as a process for communication process.

When the process 41 needs communication with the simulator B (step S31), it transmits a communication signal to the simulator B (step S32) and then is kept waiting for a message from the simulator B (step S33).

When the simulator B receives the signal from the process 41 (step S34), it causes its flag F2 to be incremented (step S35) and continues the process that was being executed before the signal reception (step S36). The flag F2 belongs to simulator B and denotes the number of signals received from any of the other processes. The initial value of the flag F2 is set to zero.

When the process 62 requires communication with the simulator B (step S37), it transmits a communication signal to the simulator B (step S38) and then waits for a message from the simulator B (step S39).

When the simulator B receives the signal from the process 62 (step S34), it also causes its flag F2 to be incremented (step S35), as seen when it receives the signal from the process 41. Whichever of the processes transmits the signal, the flag F2 is caused to be incremented in this manner every time the signal is received from any of the processes.

When the currently executing process is temporarily ended, the simulator B checks the value of its flag F2 and when the value is larger than 0, it reads out the message and confirms the process from which the signal is transmitted. When the message communication with the signal-transmitting process (process 41 or 62) is finished, it causes its flag F2 to be decremented and it checks its flag F2 again. It repeats this process until the value of its flag F2 becomes zero.

The simulator B can confirm that the signal-transmitting mate is an other simulator or process (step S5 in FIG. 9) when it checks which of its flags F1 and F2 shown in FIGS. 18 and 19 is caused to be incremented.

It will now be described how communication time is supervised. In the simulation apparatus according to the present invention, time needed for the between-simulators communication is supervised by the connection process which is achieved by command execution, for example. Operation virtually similar to that of actual devices can be simulated and a more accurate performance evaluation can be thus attained.

Figure 20:
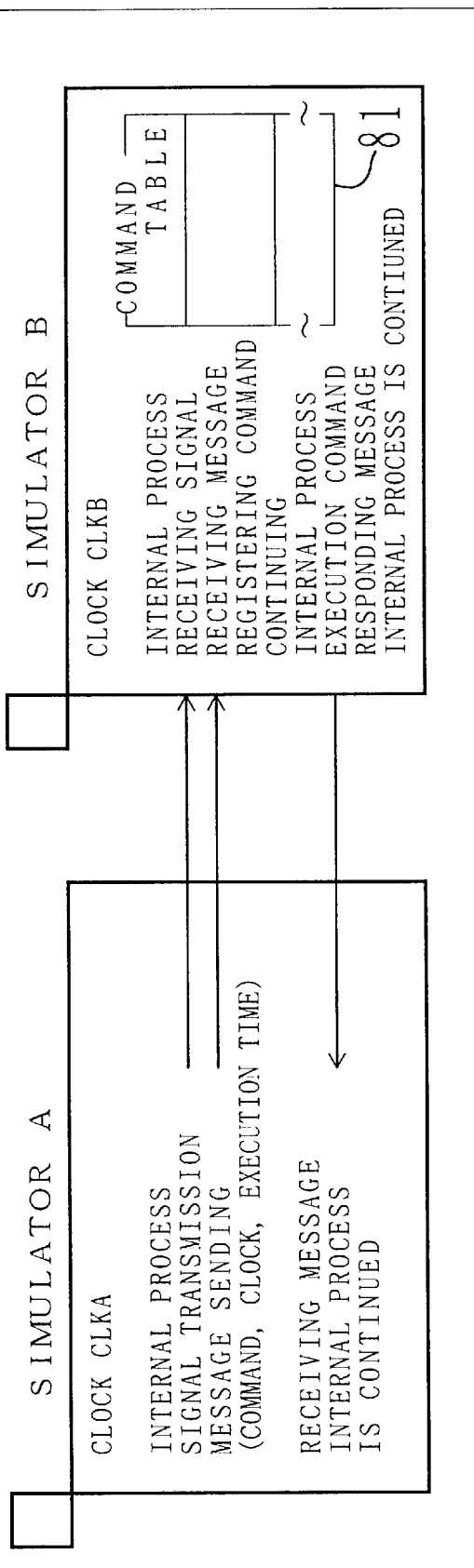
FIG. 20 shows how communication time is controlled in the present invention.

FIG. 20 shows how communication time is supervised by command execution.

When it becomes necessary to connect to the simulator B, the simulator A transmits to the simulator B a message in which a command to be executed by the simulator B and its execution time are written. Providing that the processor A operates in association with a clock CLKA and that the processor B operates in association with a clock CLKB, the simulator A allocates the command execution time by a number of cycles of the clock CLKB and transmits it to the simulator B.

The simulator B receives the message and analyzes it. The command execution time is allocated in the message. The simulator B, therefore, registers the command and its execution time once received in a command table 81. It then continues its own internal process which was stopped to receive the message. After the clock CLKB counts the number of cycles allocated, it stops its own internal process again to execute the command registered. After the command is executed, it transmits to the simulator A a message in which an answer is written, and it returns to its own internal process again.

In the simulation apparatus shown in FIG. 20, the clock in each simulator does not count during the communication between simulators. This makes it possible that time needed for signal and message communications need not be included in the command execution time. Therefore, time needed for actual communication between processors may be allocated as the command execution time.

Figure 21:
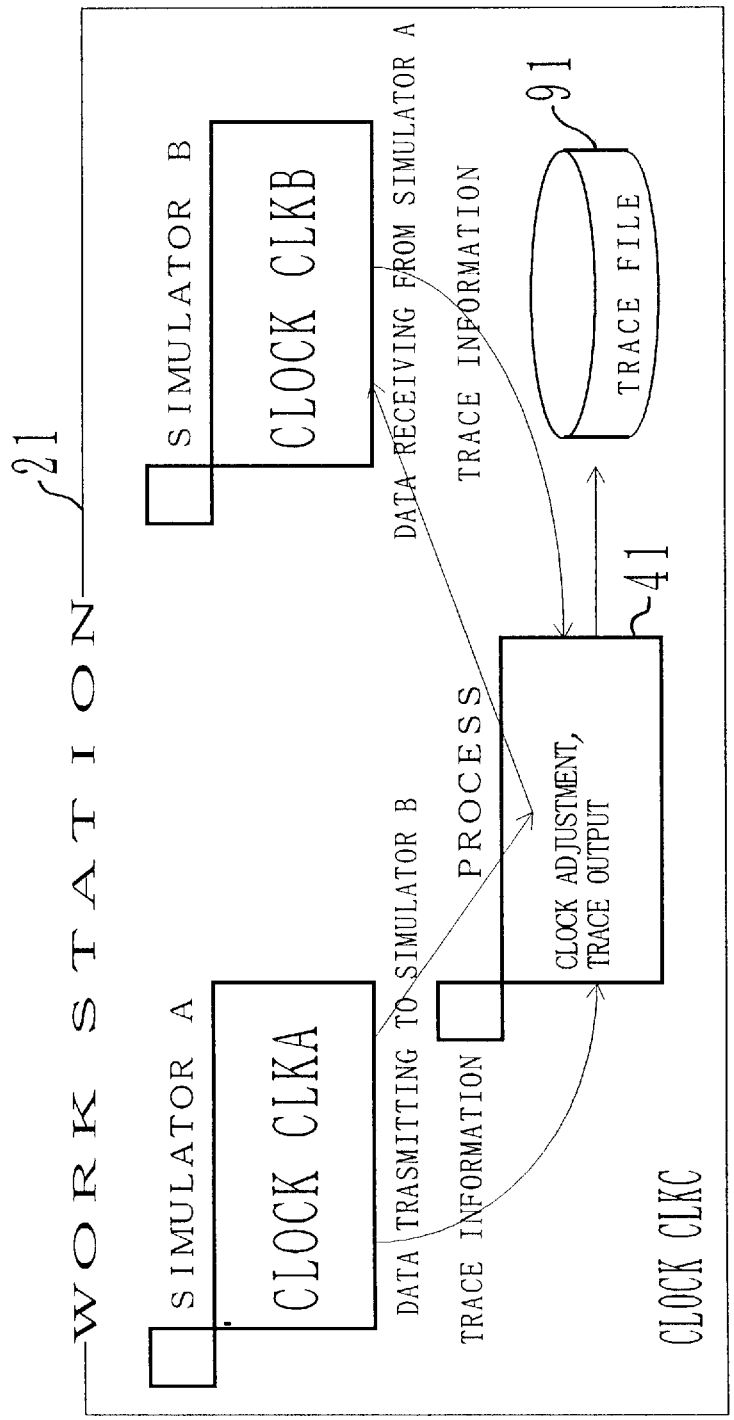
FIG. 21 shows how trace information is edited in the present invention.

FIG. 21 shows how trace information is edited in the simulation apparatus according to the present invention. The work station 21 shown in FIG. 21 operates in association with a clock CLKC, the simulator A which simulates the processor A operates in association with the clock CLKA, and the simulator B which simulates the processor B operates in association with the clock CLKB.

When the simulator A transmits data to the simulator B through the process 41, it also transmits trace information, which is related to data transmission, to the process 41. When the simulator B receives the data, it transmits trace information, which is related to data reception, to the process 41. Other trace information is transmitted from time to time to the process 41.

Taking it into consideration that the frequency of the clock CLKA is different from that of the clock CLKB, the process 41 adjusts the clocks and edits the trace information. It can therefore put the trace information, which has been time-matched, into a trace file 91. The trace edition and output process can be realized when they are processed by the process treatment portion 48 shown in FIG. 8.

According to the trace information editing method shown in FIG. 21, trace information synchronized between the simulators which operate in association with different frequency clocks can be obtained.

According to the multi-processor simulation apparatus of the present invention, the integrity of each simulator can be kept because a plurality of simulators operate independently of each other. Therefore, each simulator can simulate the program execution of each processor, not depending upon each kind of processor in the multi-processor system which is to be simulated.

When it is required that the simulator carries out its simulation while taking the multi-processor system into consideration, it synchronizes with its communication mate simulator by the asynchronous communication and exchanges information with its mate by the synchronous communication to thereby simulate its connection operation relative to its device. When the time of communication between processors is supervised, the testing and debugging of a more subtle connection timing can be achieved in the connection process by which the connection operation between processors is simulated. In addition, the testing and debugging of competitive access to connection process and shared resources can be achieved.

Further, each simulator holds information which is needed for communication with other simulators. A more feasible communication can be thus attained between optional simulators, not through any master process (or simulator).

Even if an accident happens during the test, it is easier to find and check which processor has developed problems. This is not easy when the debugging is conducted using actual devices. If a performance measuring function is added to each simulator, performance measurement relative to the multi-processor system can also be achieved.

Furthermore, the process of a single processor can be simulated together with the communication process and connection operation between processors, thereby making it unnecessary to prepare any specific program and data for these simulations.

What is claimed is:

1. A simulation apparatus for simulating a multi-processor system having a plurality of processors connected to each other and operated at the same time, said simulation apparatus comprising:

simulator preparation means, arranged in a single information processing apparatus having a single processor, for preparing a plurality of software simulators, each of which operates independently of others, to simulate, at the same time, both a communication processing which each of the plurality of processors conducts with others of the plurality of processors and an internal processing which each of the plurality of processors conducts, the internal processing not depending upon said communication processing and said communication processing being simulated between each of the plurality of software simulators and another without communicating between two of the plurality of processors; and identification information addition means for causing each of the plurality of software simulators prepared by said simulator preparation means to hold identification information relating to others of the plurality of processors needed to simulate said communication processing.

2. The simulation apparatus according to claim 1, further comprising common memories shared by the plurality of simulators, wherein the plurality of simulators gain access to said common memories to simulate the communication processing.

3. The simulation apparatus according to claim 1, wherein the simulation of the communication processing is carried out through a process which operates independently of the plurality of simulators.

4. The multi-processor simulation apparatus according to claim 3, wherein the plurality of processors are connected to each other through a common bus the said process simulates the connection which is established between the plurality of processors through the common bus.

5. A simulation apparatus in a single information processing device for simulating a multi-processor system in which a plurality of processors are connected to each other and operated at the same time, said simulation apparatus comprising:

simulator preparation means for preparing software simulators, each having identification information relating to its corresponding communication devices needed to simulate a communication processing which each of the plurality of processors conducts with others of the plurality of processors; and communication simulation means for causing the software simulators to simulate, between two of the software simulators, the communication processing without communicating between two of the plurality of processors.

6. The multi-processor simulation apparatus according to claim 6, further comprising:

processor simulation means for causing the simulators to simulate an internal processing which each of the plurality of processors conducts, the internal processing not depending upon the communication processing.

7. A simulation apparatus in an information processing apparatus for simulating a multi-processor system in which a plurality of processors are connected to each other and operated at the same time, said simulation apparatus comprising:

simulator preparation means for preparing a plurality of software simulators to simulate, at the same time, both a communication processing which each of the plurality of processors conducts with others of the plurality of processors and an internal processing which each of them conducts, the internal processing not depending upon said communication processing and said communication processing being simulated between each of the plurality of software simulators and another without communicating between two of the plurality of processors; and communication simulation means for carrying out, in the simulation of the communication processing, a synchronous communication processing by which each of the plurality of software simulators transmits contents of the communication processing to others of the plurality of software simulators, and an asynchronous communication processing by which each of the plurality of software simulators informs a start of the communication processing to others of the plurality of software simulators.

8. The simulation apparatus according to claim 7, wherein the synchronous and asynchronous communication processing are carried out through a process which operates independently of the plurality of simulators.

9. A simulation apparatus in an information processing apparatus in which a plurality of software simulators for simulating a plurality of devices are operated at the same time, said simulation apparatus comprising:

communication simulation means for causing each of the plurality of software simulators to carry out a communication processing with others of the plurality of software simulators without communicating between two of the plurality of devices;

internal simulation means for causing each of the plurality of software simulators to carry out an internal processing not depending upon the communication processing; and means for providing each of the plurality of software simulators with identification information relating to corresponding communication sites needed to simulate the communication processing so that each of the plurality of software simulators is operated independently of others of the plurality of software simulators.

10. The simulation apparatus according to claim 9, wherein each of the plurality simulators carries out both of the communication and internal processing at the same time.

11. A simulation apparatus in an information processing apparatus in which a plurality of software simulators for simulating a plurality of devices are operated at the same time, said simulation apparatus comprising:

first communication simulation means for carrying outs during simulation of communication processing between the plurality of software simulators performed without communicating between two of the plurality of devices, a synchronous communication processing by which each of the plurality of software simulators transmits contents of the communication processing to others of the plurality of software simulators; and second communication simulation means for carrying out an asynchronous communication processing by which each of the plurality of software simulators informs a start of the synchronous communication processing to others of the plurality of software simulators.

12. A debug apparatus in an information processing apparatus in which a plurality of software simulators for simulating a plurality of devices are operated at the same time, comprising:

communication simulation means for causing each of the plurality of software simulators, which has identification information relating to corresponding communication devices and which is operated independently of others of the plurality of software simulators, to carry out communication processing with others of the plurality of software simulators without communicating between two of the plurality of devices;

internal simulation means for causing each of the plurality of software simulators to carry out an internal processing not depending upon the communication processing; and debug means for debugging a program of each of the plurality of software simulators based on execution results of each of the plurality of software simulators.

13. A simulation method in a simulation of a multi-processor system in which a plurality of processors are connected to each other and operated at the same time, comprising the steps of:

preparing a plurality of software simulators each of which operates independently of others of the plurality of simulators and has identification information relating to the plurality of processors needed to simulate a communication processing which each of the plurality of software simulators conducts with others of the plurality of software simulators; and simulating the communication processing between each of the plurality of software simulators and another without communicating between two of the plurality of processors.

14. The simulation method according to claim 13, further comprising the step of simulating in each of said simulators simulates, at the same time, both the communication processing and internal processing not depending upon the communication processing.

15. The simulation method according to claim 13, wherein the plurality of simulators share a common memory, and wherein said simulating of the communication processing includes each of the plurality of simulators gaining access to said common memory.

16. The simulation method according to claim 13, wherein said step of simulating simulates the communication processing through a process which is operated independently of the plurality of simulators.

17. The multi-processor simulation method according to claim 16, wherein the process simulates a connection which is established between the plurality of processors through a common bus connecting the plurality of processors together.

18. A simulation method for simulation of a multi-processor system in which a plurality of processors are connected to each other and operated at the same time, comprising the steps of:

preparing a plurality of software simulators each of which are operated independently of the others;

simulating, at the same time, both communication processing which each of the plurality of processors conducts with others of the plurality of processors and internal processing which each of the plurality of processors conducts, the internal processing not depending upon said communication processing; and carrying out, in the simulation of the communication processing, synchronous communication processing by which each of the plurality of software simulators transmits contents of the communication processing to others of the plurality of software simulators and asynchronous communication processing by which each of the plurality of software simulators informs a start of the synchronous communication processing to others of the plurality of software simulators, both synchronous and asynchronous communication being performed without communicating between two of the plurality of processors.

19. The simulation method according to claim 18, whereby each of the plurality of simulators carries out the synchronous and asynchronous communication processing through a process which is operated independently of said plurality of simulators.

20. A simulation method in a simulation of a plurality of apparatuses which is achieved by a plurality of software simulators operated at the same time, comprising the steps of:

operating each of the plurality of software simulators independently of others of the software simulators;

simulating communication processing between the plurality of processors without communicating between two of the plurality of apparatuses; and carrying out both synchronous communication processing by which each of the plurality of software simulators transmits contents of the communication processing to others of the plurality of software simulators and asynchronous communication processing by which each of the plurality of software simulators informs a start of the synchronous communication processing to the others.

21. A program debug method in a simulation of a plurality of apparatuses which is achieved by a plurality of software simulators operated at the same time, comprising the steps of:

operating each of the plurality of software simulators independently of others of the plurality of software simulators;

holding identification information relating to corresponding communication apparatuses needed to carry out communication processing with others of the plurality of software simulators without communicating between two of the plurality of apparatuses;

carrying out internal processing not dependent upon the communication processing, by executing a program; and debugging the program based on results obtained when each of the plurality of software simulators executes the program.

22. A simulation apparatus for simulating a multi-processor system with a plurality of processors connected to each other and operated in parallel, said simulation apparatus comprising:

an information processing apparatus to prepare a plurality of software simulators, each software simulator operating independently of others of the software simulators to simulate, at the same time, both internal processing of one of the processors and communication processing of the one of the processors with others of the processors, the internal processing not depending upon the communication processing and the communication processing not requiring communication between separate processing units of said information processing apparatus, each of the software simulators holding identification information relating to the others of the processors used in simulating the communication processing.

23. A method for simulating a multi-processor system having a plurality of processors connected to each other and operated in parallel, said method comprising:

preparing a plurality of simulator programs for execution by an information processing apparatus, each simulator program simulating both internal processing of one of the processors and communication processing of the one of the processors with others of the processors, the internal processing not depending upon the communication processing and the communication processing not requiring communication between separate processing units of the information processing apparatus, each of the simulator programs holding identification information relating to the others of the processors used in simulating the communication processing; and executing the simulator programs in parallel to simulate the multi-processor system, each of the simulator programs operating independently of others of the simulator programs.

* * * * *

UNITED STATES PATENT AND TRADEMARK OFFICE
CERTIFICATE OF CORRECTION

PATENT NO. : 5,805,867
DATED : September 8, 1998
INVENTOR(S) : Kodaira

It is certified that error appears in the above-identified patent and that said Letters Patent is hereby corrected as shown below:

Col. 6, line 3, change "pseudo-memories" to --pseudo memories--

Col. 16, line 16, change "claim 6" to --claim 5--.

Col. 17, line 11, change "outs" to --out,--.

Signed and Sealed this

Fourth Day of May, 1999

Attest:

Attesting Officer

Q. TODD DICKINSON

Acting Commissioner of Patents and Trademarks